US011411296B2

(12) United States Patent
Dahle et al.

(10) Patent No.: US 11,411,296 B2
(45) Date of Patent: Aug. 9, 2022

(54) FLEXIBLE RADIO FREQUENCY ASSEMBLIES, COMPONENTS THEREOF AND RELATED METHODS

(71) Applicants: The Research Foundation for the State University of New York, Albany, NY (US); Mohamed Ramadan, Boise, ID (US)

(72) Inventors: Reena Dahle, New Paltz, NY (US); Mohamed Ramadan, Boise, ID (US)

(73) Assignee: THE RESEARCH FOUNDATION FOR THE STATE UNIVERSITY OF NEW YORK STATE, Albany, NY (US)

( * ) Notice: Subject to any disclaimer, the term of this patent is extended or adjusted under 35 U.S.C. 154(b) by 674 days.

(21) Appl. No.: 16/296,141

(22) Filed: Mar. 7, 2019

(65) Prior Publication Data
US 2019/0280363 A1 Sep. 12, 2019

Related U.S. Application Data

(60) Provisional application No. 62/639,764, filed on Mar. 7, 2018.

(51) Int. Cl.
H01Q 1/08 (2006.01)
H01Q 1/22 (2006.01)
(Continued)

(52) U.S. Cl.
CPC ........... *H01Q 1/085* (2013.01); *H01Q 1/2283* (2013.01); *H01Q 9/0407* (2013.01);
(Continued)

(58) Field of Classification Search
CPC ................ H05K 1/0353; H05K 2201/0187
See application file for complete search history.

(56) References Cited

U.S. PATENT DOCUMENTS 10,237,989 B1 * 3/2019 Peters ................ G06F 1/182
10,476,293 B2 * 11/2019 Trogan ................ H02J 50/20
(Continued)

FOREIGN PATENT DOCUMENTS

CN 109888452 A * 6/2019

*Primary Examiner* — Ab Salam Alkassim, Jr.
(74) *Attorney, Agent, or Firm* — Austin Winter; Michael Krenicky; Steven A. Wood, Jr.

(57) ABSTRACT

The present application provides flexible radio frequency (RF) assemblies, components thereof and related methods. The present application includes at least one flexible substrate comprising first and second sides, a flexible framework portion comprising a first material composition and a plurality of discrete spaced interior portions comprising second material compositions that differ from that of the flexible framework portion. The framework portion extends fully about a portion of each interior portion. The framework portion comprises a flexibility that is greater than that of the interior portions. Each interior portion and the framework portion comprise a dielectric constant, a loss tangent, a volume resistivity, a surface resistivity and a magnetic relative permeability. At least one of the dielectric constant, the loss tangent, the volume resistivity, the surface resistivity and the magnetic relative permeability of at least one of the interior portions differs from that of the framework portion.

24 Claims, 8 Drawing Sheets

(51) Int. Cl.
 *H05K 3/36* (2006.01)
 *H05K 1/02* (2006.01)
 *H05K 1/03* (2006.01)
 *H01Q 9/04* (2006.01)

(52) U.S. Cl.
 CPC ......... *H05K 1/0237* (2013.01); *H05K 1/0393* (2013.01); *H05K 3/361* (2013.01)

(56) References Cited

U.S. PATENT DOCUMENTS

| | | | | |
|---|---|---|---|---|
| 2005/0110680 | A1* | 5/2005 | Tanaka | H01Q 1/38 343/700 MS |
| 2006/0170597 | A1* | 8/2006 | Kurashima | H01Q 1/22 343/700 MS |
| 2010/0328171 | A1* | 12/2010 | Mak | H01Q 1/42 343/720 |
| 2012/0249375 | A1* | 10/2012 | Heino | B05D 3/06 343/700 MS |
| 2013/0321212 | A1* | 12/2013 | O'Shea | H01Q 9/42 343/700 MS |
| 2019/0058236 | A1* | 2/2019 | Hussain | H01Q 9/42 |
| 2019/0059155 | A1* | 2/2019 | Harple | H05K 1/0393 |
| 2019/0261509 | A1* | 8/2019 | Froese | H05K 1/0393 |
| 2021/0063099 | A1* | 3/2021 | Cola | H05K 7/20409 |
| 2021/0223883 | A1* | 7/2021 | Xu | G06F 3/0446 |
| 2021/0315093 | A1* | 10/2021 | Kristl | H05K 1/0306 |

* cited by examiner

FLEXIBLE RADIO FREQUENCY ASSEMBLIES, COMPONENTS THEREOF AND RELATED METHODS

CROSS-REFERENCE TO RELATED APPLICATION

This application claims priority benefit under 35 U.S.C. § 119(e) to U.S. Provisional Application No. 62/639,764, filed Mar. 7, 2018, and entitled Flexible Tile Array Wearable Antennas, the entirety of which is incorporated herein by reference in its entirety.

FIELD OF THE DISCLOSURE

The present disclosure is generally directed to flexible antenna assemblies, components thereof and related methods. More particularly, the present disclosure is directed to flexible heterogeneous substrates (e.g., including one or more dielectric materials) for radio frequency (RF) assemblies (e.g., RF antenna assemblies). These substrates comprise a relatively flexible framework portion formed of a first material composition that extends about a portion of a plurality of distinct, relatively inflexible interior portions. These interior portions are formed of a second material composition, the RF performance of at least one of the interior portions being different from that of the framework portion in at least one aspect (e.g., at least one of the interior portions including at least one improved RF metric as compared to that of the framework portion).

BACKGROUND

Conformal antennas that are lightweight, robust and can withstand mechanical strain with minimal impact on radio frequency (RF) performance are highly desirable for use in the fields of wireless sensor networks and the Internet of Things (IoT), for example. Such conformal antennas can thereby be utilized in applications with arbitrarily shaped static surfaces and/or moving portions or components, such as in wearable applications. For example, wearable conformal RF antennas are particularly advantageous for use with flexing/flexible body parts, such as elbows, finger joints, wrists, knees, ankles, necks, etc.

Some wearable RF antennas make use of a flexible substrate to provide, at least in part, its conformal nature, such as flexible textile substrates, flexible paper-based substrates and flexible synthesized substrates. Textile and paper-based substrates are limited in thickness and susceptible to fluid absorption, and are thereby incompatible with many applications. Moreover, such flexible textile substrates, flexible paper-based substrates and flexible synthesized substrates are limited in their ability to be customized to provide a particular bandwidth and/or gain, for example, such as for a particular RF antenna application.

Recent advancements in 3-D printing technology have demonstrated the potential to provide an additional degree of freedom in creating innovative RF and antenna components. Fused deposition modeling (FDM) is the most common 3-D printing technique and functions by building physical objects up layer-by-layer using a heated extruder to create arbitrary 3-D designs. The advantages of 3-D printing technology over conventional manufacturing techniques include fast turn-around time, reduced cost and the ability to fabricate complex structures with multiple materials.

Many current 3-D printed flexible substrates for RF antennas, such as via FDM, are fully formed of a thermoplastic elastomer (TPE) comprising a combination of a thermoplastic elastomer and a rubber (e.g., NinjaFlex® sold by Fenner Drives, Inc. of Manheim, Pa.). TPE substrates typically include a relatively low modulus, and a relatively flexible and stretchable material construct. However, substrates formed from such TPE materials include a relative permittivity and/or loss tangent that is not ideal for many RF applications and/or frequencies (e.g., a relative permittivity of about 3 and/or or a loss tangent of about 0.06 at 2.4 GHz), and result in relatively low gain, especially when printed with a 100% infill density.

Some attempts at improving the RF characteristics of 3-D printed TPE-based RF antenna substrates have focused on varying the infill density (i.e., the print density) of the TPE material. Unfortunately, reducing the infill density by introducing air gaps in a TPE RF antenna substrate may compromise the mechanical integrity of the substrate, and may result in material fatigue in an application where mechanical durability and performance repeatability are essential, for example. Another drawback to introducing air gaps in a TPE RF antenna substrate to reduce the infill of the TPE material, and thereby increase RF performance, is that the air gaps vary the dielectric constant and/or loss tangent of the antenna, resulting in a need for the RF antenna design to be updated or redesigned for a particular application when used with the substrate.

Accordingly, improved RF components, assemblies and related methods are desirable. For example, substrates for flexible passive and/or low power RF devices (e.g., IoT wearable RF devices) and/or flexible RF circuits that are flexible, can withstand mechanical strain and are tunable/configurable/designable to provide preferred or optimal RF characteristics/properties for a particular application are therefore desirable.

Further, substrates for flexible passive and/or low power RF devices (e.g., IoT wearable RF devices) and/or flexible RF circuits that can be customized to tune/select/configure at least one of the dielectric constant, loss tangent or dissipation factor, resistivity (e.g., surface resistivity and/or volume (e.g., Z-axis or thickness volume) and magnetic relative permeability thereof (e.g., to provide a particular bandwidth and/or gain, for example) are therefore also desirable.

Furthermore, substrates for flexible passive and/or low power RF devices (e.g., IoT wearable RF devices) and/or flexible RF circuits that provide relatively high RF stability (i.e., relatively stable RF characteristics/properties, such as bandwidth) when deformed from a natural or neutral physical configuration to a deformed physical configuration are therefore also desirable.

SUMMARY

In one aspect, the present disclosure provides a flexible radio frequency (RF) antenna assembly. The antenna assembly comprises at least one flexible substrate comprising a first side, a second side opposing the first side, a flexible framework portion and a plurality of discrete spaced interior portions. The framework portion extends fully about at least a portion of each of the discrete spaced interior portions. The framework portion comprises a material composition that differs from material compositions of the interior portions, and a flexibility that is greater than flexibilities of at least some of the interior portions. The antenna assembly also comprises at least one flexible conductive antenna element extending over the first side of the substrate. The antenna assembly further comprises at least one flexible conductive ground member extending over the second side of the substrate. Each interior portion and the framework portion comprise a dielectric constant, a loss tangent, a volume resistivity, a surface resistivity and a magnetic relative permeability. At least one of the dielectric constant, the loss tangent, the volume resistivity, the surface resistivity and the magnetic relative permeability of at least one of the interior portions differs from that of the framework portion.

In some embodiments, the framework portion comprises at least one of a Young's modulus of less than or equal to 16 Mpa, a yield tensile strength of less than or equal to 5 Mpa and an ultimate tensile strength less than or equal to 32 Mpa, and at least some of the plurality of interior portions comprise at least one of a Young's modulus, a yield tensile strength and an ultimate tensile strength that is at least 100% greater than that of the framework portion. In some such embodiments, the framework portion comprises a Young's modulus of less than or equal to 16 Mpa, a yield tensile strength of less than or equal to 5 Mpa and an ultimate tensile strength less than or equal to 32 Mpa, and at least some of the plurality of interior portions comprise a Young's modulus, a yield tensile strength and an ultimate tensile strength that is at least 100% greater than that of the framework portion.

In some embodiments, the combination of at least two of the dielectric constant, the loss tangent, the volume resistivity, the surface resistivity and the magnetic relative permeability of at least one of the interior portions differs from that of the framework portion. In some embodiments, the dielectric constant of at least one of the interior portions differs from that of the framework portion. The loss tangent of at least one of the interior portions differs from that of the framework portion, the volume resistivity of at least one of the interior portions differs from that of the framework portion, the surface resistivity of at least one of the interior portions differs from that of the framework portion, and the magnetic relative permeability of at least one of the interior portions differs from that of the framework portion. In some embodiments, at least one of the dielectric constant, the loss tangent, the volume resistivity, the surface resistivity and the magnetic relative permeability of at least one interior portion of the plurality of interior portions differs from that of at least one other interior portion of the plurality of interior portions.

In some embodiments, the dielectric constant, the loss tangent, the volume resistivity, the surface resistivity and the magnetic relative permeability of at least one of the interior portions differs from that of the framework portion. In some embodiments, at least one of the dielectric constant, the loss tangent, the volume resistivity, the surface resistivity and the magnetic relative permeability of each of the interior portions differs from that of the framework portion.

In some embodiments, the material composition of the framework portion comprises a flexible polymer. In some such embodiments, the flexible polymer is a thermoplastic polyurethane.

In some embodiments, the framework portion includes an infill density within the range of about 30% to about 100%. In some embodiments, the material compositions of the interior portions comprise ASA, PC, ABS, PC-ABS, ABSi, PLA, soft PLA, HIPS, PVA, polyamides, polyimides, Nylon, Nylon 6/6, PET, PETT, TPE, LDPE, PTFE, PS, PMMA, PVC, POM, PBT, PPO, PA, PI, PAI, PEI, PSU, PEEK or any combination thereof. In some embodiments, the material compositions of the interior portions comprise a polymer, a powder, a gel, a liquids or any combination thereof.

In some embodiments, the interior portions each include an infill density of the flexible thermoplastic elastomer within the range of about 40% to about 100%. In some such embodiments, the dielectric constant of the framework portion is within the range of about 2 to about 3, and the loss tangent of the framework portion is within the range of about 0.04 to about 0.06.

In some embodiments, the substrate is planar in a natural state. In some such embodiments, the antenna assembly includes at least one of a bandwidth, a frequency, a resonant frequency, a gain and a return loss that varies less than 10% from when the flexible substrate is deformed from the natural state into an arcuate shape along one axis that is defined by a radius of greater than or equal to 28 mm.

In some embodiments, the substrate comprises a plurality of coupled tiles, each tile including at least one interior portion of the plurality of interior portions and an associated portion of the framework portion that extends about a portion of the respective at least one interior portion. In some such embodiments, the plurality of coupled tiles comprises a plurality of first tiles with at least one projection extending from at least one lateral side thereof, and plurality of second tiles with at least one recess extending from at least one lateral side thereof, and the at least one projection of the first tiles and the at least one recess of the second tiles couple together to couple the tiles together.

In another aspect, the present disclosure provides a method comprising manufacturing a flexible heterogeneous substrate for a flexible radio frequency (RF) device. The manufacturing method comprises forming a flexible framework portion of a first material composition, the framework portion comprising a first dielectric constant, a first loss tangent, a first volume resistivity, a first surface resistivity and a first magnetic relative permeability. The manufacturing method further comprises forming a plurality of discrete spaced interior portions of second material compositions that differ from the first material composition, the interior portions comprising second dielectric constants, second loss tangents, second volume resistivities, second surface resistivities and second magnetic relative permeabilities. The framework portion extends fully about at least a portion of each of the interior portions. The framework portion comprises a flexibility that is greater than flexibilities of at least some of the interior portions. At least one of the second dielectric constants, the second loss tangents, the second volume resistivities, the second surface resistivities and the first magnetic relative permeabilities of at least one of the interior portions differs from the first dielectric constant, the first loss tangent, the first volume resistivity, the first surface resistivity and the first magnetic relative permeability, respectively, of the framework portion.

In some embodiments, the method further comprises forming a flexible RF antenna from the manufactured flexible heterogeneous substrate. The forming the flexible RF antenna comprises coupling at least one flexible conductive antenna element to the substrate such that the at least one antenna element extends over a first side of the substrate. The forming the flexible RF antenna further comprises coupling at least one flexible conductive ground member to the substrate such that the at least one flexible conductive ground member extends over a second side of the substrate that opposes the first side of the substrate.

In another aspect, the present disclosure provides a flexible radio frequency (RF) device. The device comprises at least one flexible substrate comprising a first side, a second side opposing the first side, a flexible framework portion and a plurality of discrete spaced interior portions, the framework portion extending fully about at least a portion of each of the discrete spaced interior portions. The framework portion comprises a flexibility that is greater than flexibilities of at least some of the interior portions. Each interior portion and the framework portion comprise a dielectric constant, a loss tangent, a volume resistivity, a surface resistivity and a magnetic relative permeability, and at least one of the dielectric constant, the loss tangent, the volume resistivity, the surface resistivity and the magnetic relative permeability of at least one of the interior portions differs from that of the framework portion.

In some embodiments, the at least one flexible substrate forms at least one carrier component of a flexible RF device. In some such embodiments, the flexible RF device comprises a flexible RF antenna, a flexible RF filter, a flexible RF sensor, a flexible RF power divider or a flexible RF detector.

It should be appreciated that all combinations of the foregoing aspects and additional concepts discussed in greater detail below (provided such concepts are not mutually inconsistent) are contemplated as being part of the inventive subject matter disclosed herein.

These and other objects, features and advantages of this disclosure will become apparent from the following detailed description of the various aspects of the disclosure taken in conjunction with the accompanying drawings.

BRIEF DESCRIPTION OF THE DRAWINGS

These and other features, aspects, and advantages of the present invention will become better understood when the following detailed description is read with reference to the accompanying drawings, which are not necessarily drawn to scale and in which like reference numerals represent like aspects throughout the drawings, wherein.

DETAILED DESCRIPTION

Figure 1:
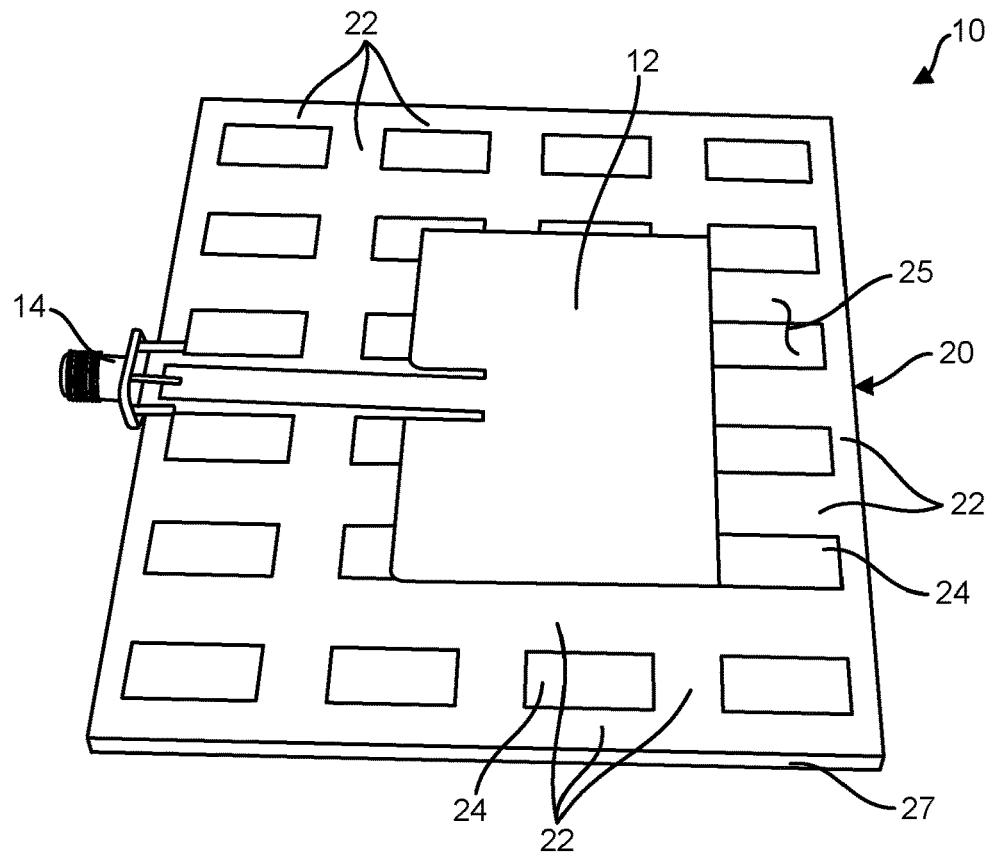
FIG. 1 illustrates an elevational view of an exemplary embodiment of a flexible radio frequency (RF) antenna assembly according to the present disclosure.

Aspects of the present disclosure and certain examples, features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the relevant details. It should be understood, however, that the detailed description and the specific examples, while indicating aspects of the disclosure, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout disclosure, may be applied to modify any quantitative representation that could permissibly vary without resulting in a change in the basic function to which it is related. Accordingly, a value modified by a term or terms, such as "about" or "substantially," is not limited to the precise value specified. For example, these terms can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. In some instances, the approximating language may correspond to the precision of an instrument for measuring the value.

Terminology used herein is for the purpose of describing particular examples only and is not intended to be limiting. As used herein, the singular forms "a", "an" and "the" are intended to include the plural forms as well, unless the context clearly indicates otherwise. Furthermore, references to "one example" are not intended to be interpreted as excluding the existence of additional examples that also incorporate the recited features.

Moreover, unless explicitly stated to the contrary, the terms "comprising" (and any form of "comprise," such as "comprises" and "comprising"), "have" (and any form of "have," such as "has" and "having"), "include" (and any form of "include," such as "includes" and "including"), and "contain" (and any form of "contain," such as "contains" and "containing") are used as open-ended linking verbs.

As a result, any examples that "comprises," "has," "includes" or "contains" one or more step or element possesses such one or more step or element, but is not limited to possessing only such one or more step or element.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb.

Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Components, aspects, features, configurations, arrangements, uses and the like described, illustrated or otherwise disclosed herein with respect to any particular figure or embodiment may similarly be applied to any other figure or embodiment disclosed herein.

FIGS. 1-4 illustrate a flexible radio frequency (RF) antenna assembly 10, and related methods, according to the present disclosure. The antenna assembly 10 is flexible and conformal, and able to withstand mechanical strain with minimal impact on RF performance. As such, the antenna assembly 10 comprises a wearable antenna.

The antenna assembly 10 is customizable to tune RF properties thereof, such as at least one of the bandwidth, gain, relative dielectric permittivity (i.e., dielectric constant), loss tangent, surface resistivity, volume/thickness resistivity, magnetic relative permeability, frequency, resonant frequency, return loss, transmission coefficient, reflection coefficient, directivity, radiation efficiency, radiation pattern or a combination thereof.

Still further, the antenna assembly 10 includes a relatively high antenna RF stability (i.e., has relatively stable RF characteristics/properties, such as at least one of the bandwidth, gain, relative dielectric permittivity, loss tangent, surface resistivity, volume/thickness resistivity, magnetic relative permeability, frequency, resonant frequency, return loss, transmission coefficient, reflection coefficient, directivity, radiation efficiency, radiation pattern or a combination thereof) between a natural or neutral physical configuration and a flexed/deformed physical configuration.

For example, in some embodiments such as at least one of the bandwidth, gain, relative dielectric permittivity, loss tangent, surface resistivity, volume/thickness resistivity, magnetic relative permeability, frequency, resonant frequency, return loss, transmission coefficient, reflection coefficient, directivity, radiation efficiency, radiation pattern or a combination thereof of the antenna assembly 10 varies between a natural planar shape and a deformed curved shape (e.g., concave or convex along one axis/direction defined by a radius of greater than or equal to 28 mm) by less than about 40%, or less than about 30%, or less than about 20%, or less than about 10%, or less than about 5%, or less than about 2.5%, or less than about 1%.

The antenna assembly 10 may be deformed (elastically and/or plastically) by at least one of flexing, bending, extending and flattening the assembly, such as manually. In one exemplary (i.e., non-limiting) embodiment, the antenna assembly 10 comprises a resonant frequency of about 2.3 GHz with an associated bandwidth in a range of about 0.1 GHz to about 0.12 GHz when in a planar natural or neutral state or configuration, and a resonant frequency of about 2.305 GHz with an associated bandwidth in a range of about 0.1 GHz to about 0.12 GHz when in a flexed or deformed state or configuration (e.g., a concave or convex shape along one axis with a curvature radius of about 28 mm).

The antenna assembly 10 also includes a relatively high antenna RF stability (i.e., has relatively stable RF characteristics/properties, such as at least one of the bandwidth, gain, relative dielectric permittivity, loss tangent, surface resistivity, volume/thickness resistivity, magnetic relative permeability, frequency, resonant frequency, return loss, transmission coefficient, reflection coefficient, directivity, radiation efficiency, radiation pattern or a combination thereof) with the influence of a mammalian body, such as a human body.

For example, in some embodiments at least one of the bandwidth, gain, relative dielectric permittivity, loss tangent, surface resistivity, volume/thickness resistivity, magnetic relative permeability, frequency, resonant frequency, return loss, transmission coefficient, reflection coefficient, directivity, radiation efficiency, radiation pattern, or a combination thereof of the antenna assembly 10 varies between being positioned on a mammalian body surface (e.g., a convex portion thereof, such as a human's wrist) in a natural planar shape and in a deformed shape substantially conformal to the body surface (e.g., arcuately convex) by less than about 40%, or less than about 30%, or less than about 20%, or less than about 10%, or less than about 5%, or less than about 2.5%, or less than about 1%.

In some embodiments, the flexible antenna assembly 10 is configured to operate at a frequency in the microwave frequency range and/or a millimeter frequency range. In some embodiments, the flexible antenna assembly 10 is configured to operate at a frequency in the range of approximately 500 MHz to approximately 100 GHz, or in the range of approximately 500 MHz to approximately 20 GHz.

As shown in FIGS. 1-4, the antenna assembly 10 is configured as a flexible microstrip antenna and may comprise a flexible microstrip patch antenna. However, it is understood that other RF antenna configurations may equally be employed without departing from the spirit and scope of the present disclosure.

In some embodiments, the antenna assembly 10 includes a flexible heterogeneous insulating/dielectric substrate 20 comprising a flexible framework 22 formed of a first material composition (e.g., at least one thermoplastic elastomer) that extends about a portion of a plurality of distinct inflexible interior portions 24 formed of a second material composition (e.g., at least one polymer), as shown in FIGS. 1-4.

As also shown in FIGS. 1-4, the antenna assembly 10 further includes at least one flexible conductive antenna element 12 affixed to a first or top side 25 of the flexible heterogeneous substrate 20 over the flexible framework portion 22 and the distinct interior portions 24, and at least one flexible conductive ground plane member 16 affixed to a second or bottom side 27 of the flexible heterogeneous substrate 20 over the flexible framework portion 22 and the distinct interior portions 24 that opposes the first side 25 of the flexible heterogeneous substrate 20.

An RF potential difference is either applied (when the antenna assembly 10 is utilized as an RF transmitting antenna) or produced (when the antenna assembly 10 is utilized as an RF receiving antenna) between the at least one antenna element 12 and the at least one ground plane member 16 (through the substrate 20) that induces a surface current on the antenna element 12.

The at least one flexible conductive antenna element 12 may be affixed to the first side 25 of the flexible heterogeneous substrate 20, and the at least one flexible conductive ground plane member 16 may be affixed to the second side 27 of the flexible heterogeneous substrate 20, via any mechanical and/or chemical mechanism.

The flexible conductive antenna element 12 may comprise any flexible, relatively thin electrically conductive element(s) or member(s), such as any deformable conductive material film or foil. In some embodiments, the antenna element 12 may comprise an electrically conductive patch (of any shape), which may be fabricated via microstrip techniques.

As shown in the exemplary illustrated embodiment in FIG. 1, in some embodiments the antenna element 12 may comprise a flexible thin sheet or patch of metal material (e.g., copper) that is coupled to or mounted on the first side 25 of the flexible heterogeneous substrate 20.

In some other embodiments, the antenna element 12 may comprise an array of interconnected metal patches (of one or more shapes). Each patch of the antenna element 12, or the antenna element 12 as a whole, may comprise a circular shape, an elliptical shape, a dipole shape, a 'T' shape, an 'H' shape, an 'I' shape, a 'V' shape, an 'X' shape, a line shape, a '=' shape, a parallel lines shape, a '+' shape, an intersecting lines shape, a '#' shape, a lattice shape, an asterisk shape, a regular polygonal shape, a simple polygonal shape, an equilateral polygonal shape, an equiangular polygonal shape, a convex polygonal shape, a concave polygonal shape, an isogonal polygonal shape, a triangular shape, a quadrilateral shape, a tetragonal shape, a square shape, a rhombus shape, a pentagonal shape, a hexagonal shape, a heptagonal shape, an octagonal shape, a nonagonal shape, or a decagonal shape on the first side 25 of the flexible heterogeneous substrate 20, for example.

Figure 2:
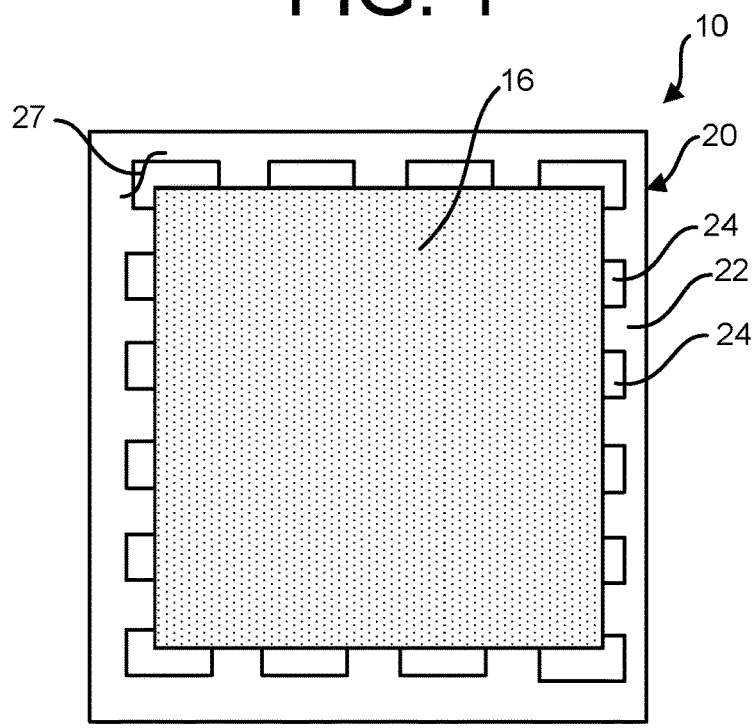
FIG. 2 illustrates a bottom view of the flexible RF antenna assembly of FIG. 1.
Figure 3:
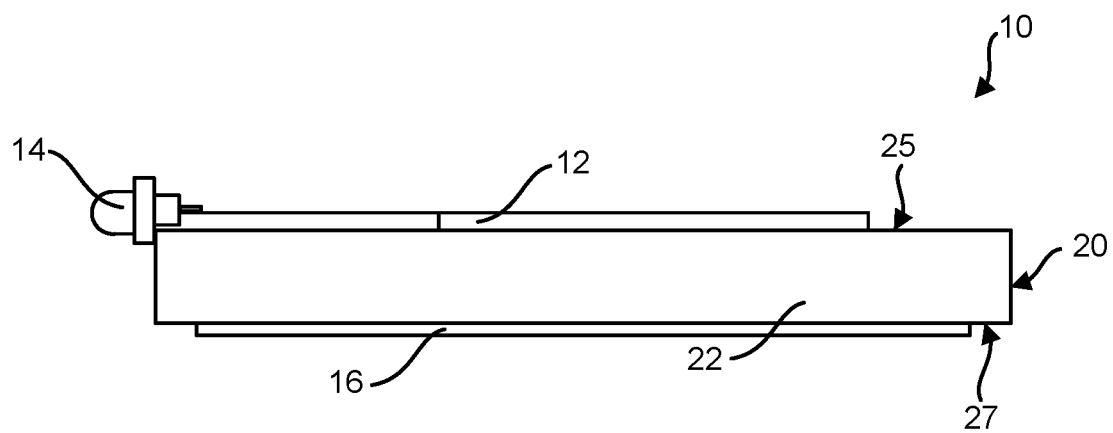
FIG. 3 illustrates a side view of the flexible RF antenna assembly of FIG. 1 in a natural state.
Figure 4:
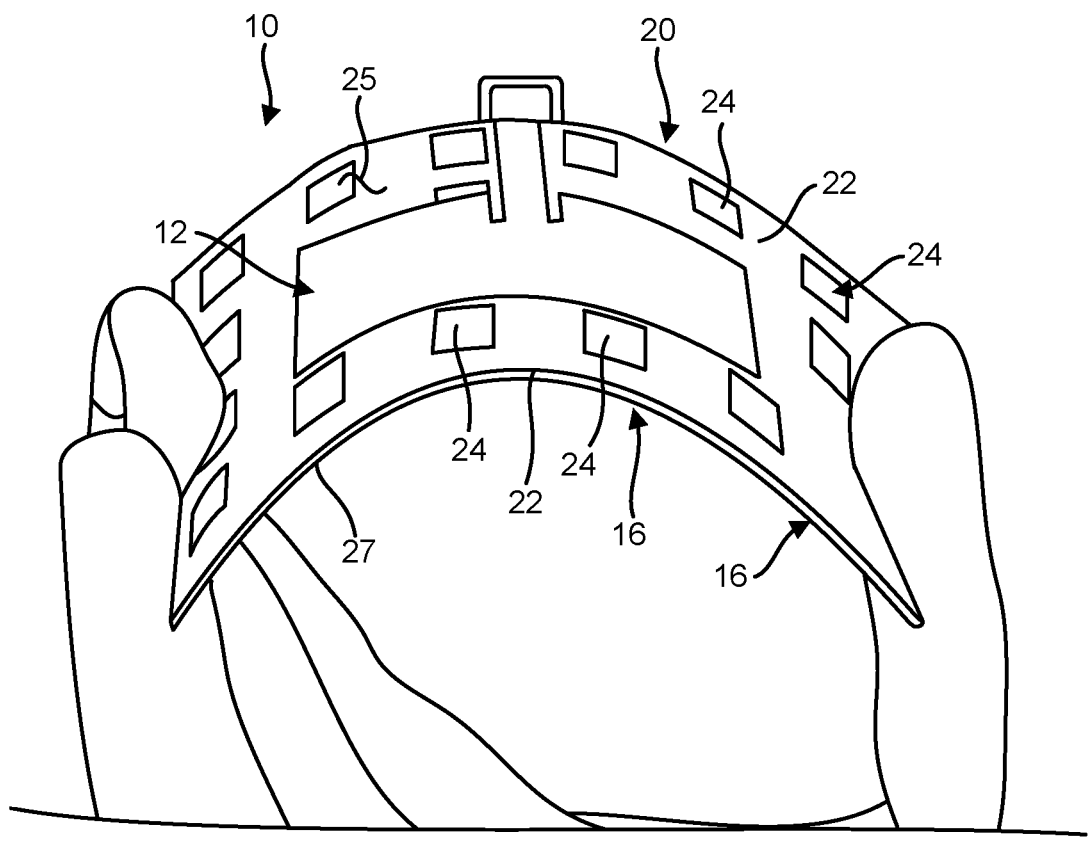
FIG. 4 illustrates an elevational side view of the flexible RF antenna assembly of FIG. 1 in a deformed state.

However, the antenna element 12 may comprise any shape or configuration on the first side 25 of the flexible heterogeneous substrate 20. The antenna element 12 may be flexible such that it conforms to the natural or neutral shape of the first side 25 of the flexible heterogeneous substrate 20. In some embodiments, in a natural or neutral state of the antenna assembly 10, as shown in FIGS. 1-3, the antenna element 12 (or at least a patch or film portion thereof) may be planar or flat.

As shown in FIG. 1, the antenna element 12 may extend over at least a portion of the first side 25 of the flexible heterogeneous substrate 20. In some embodiments, the antenna element 12 may not extend to the peripheral sides or side edges of the flexible heterogeneous substrate 20. For example, in some embodiments, the antenna element 12 may be smaller in the width W1 and/or length L1 directions than the flexible heterogeneous substrate 20 and/or the ground plane member 16, such as by a fraction (e.g., 0.1 wavelength).

In some embodiments, the antenna element 12 may be centered on the first side 25 of the substrate 20. However, the antenna element 12 may be any size and positioned anywhere on or over the first side 25 of the flexible heterogeneous substrate 20. In some alternative embodiments (not shown), the antenna element 12 may extend over the entirety of the first side 25 of the flexible heterogeneous substrate 20.

The antenna element 12 may be formed, at least in part, of one or more electrically conductive material (e.g., a metal) or semiconductor material. In some embodiments, the antenna element 12 may comprise one or more semiconductor film, graphene film, nanotube film, carbon nanotube film, boron nanotube film, boron nitride nanotube film, boron carbide nanotube film, metal film or foil, metal alloy film or foil, metal tape, and metal alloy tape, or a combination thereof.

The antenna element 12 may be directly or indirectly coupled to the first side 25 of the flexible heterogeneous substrate 20. For example, the flexible conductive antenna element 12 may be affixed to the first side 25 of the flexible heterogeneous substrate 20 via a flexible adhesive (e.g., a flexible epoxy).

As noted above, the antenna element 12 may be relatively thin (in a thickness direction extending along a direction extending between the first and second sides 25, 27 of the flexible heterogeneous substrate 20), such as being thinner than the thickness of the flexible heterogeneous substrate 20. For example, in some embodiments the maximum thickness of the antenna element 12 may be less than about 2 mm, or less than about 1 mm, or less than about ½ mm, or less than about ¼ mm.

In some embodiments, thickness of the antenna element 12 is dependent on the skin depth, such as the thickness thereof being within the range of about 3-5 times the skin depth. As known in the art, the skin depth is dependent, at least in part, of the resonant frequency or frequency of operation of the antenna assembly 10, which may vary depending upon the configuration/application of a specific antenna assembly 10.

As shown in FIGS. 1 and 3, the antenna element 12 of the antenna assembly 10 is configured to be electrically coupled to a transmitter (that generates radio frequency alternating current) or a receiver (that receives radio frequency alternating current and converts it to a usable form) via or through a connector 14. In some embodiments, the connector 14 may be physically coupled to the flexible heterogeneous substrate 20. The connector 14 may be coupled (directly or indirectly) to the antenna element 12, such as to a portion of the antenna element 12 extending to, or proximate to, the periphery of the flexible heterogeneous substrate 20, as shown in FIGS. 1 and 3.

In other embodiments (not shown), the connector 14 may be coupled to the antenna element 12 via at least one conductive wire, transmission line (e.g., microstrip transmission line, such as a foil microstrip transmission line) or like conductive connection member.

The connector 14 (and at least one conductive connection member, if provided) is thereby configured to conduct alternating current of radio frequency to the antenna element 12 (when the antenna assembly 10 is configured or utilized as an RF transmitting antenna) and/or from the antenna element 12 (when the antenna assembly 10 is configured or utilized as an RF receiving antenna). The connecter 14 may be configured to couple to a feeder or feeder line that is configured to also couple to the RF transmitter and/or receiver.

As discussed above, RF voltage or potential difference is applied (when the antenna assembly 10 is utilized as an RF transmitting antenna) or produced (when the antenna assembly 10 is utilized as an RF receiving antenna) between the antenna element 12 and the at least one flexible ground plane member 16 (through the flexible heterogeneous substrate 20), which generates an RF current on the surface of the antenna element 12.

The antenna element 12 and the ground plane member 16 together may form a resonant piece of transmission line with a length of approximately one-half wavelength of the radio waves. The at least one flexible ground plane member 16 forms or defines an electrically conductive surface, such as the surface thereof that is affixed to the second side or surface 27 of the substrate 20.

The flexible ground plane member 16 is configured to reflect the radio waves from the antenna element 12. The electrically conductive surface of the flexible ground plane member 16 may be at least a quarter of the wavelength ($\lambda/4$) of the radio waves in diameter. The flexible ground plane member 16 may form or define a continuous electrically conductive surface, or may form a discontinuous electrically conductive surface.

The flexible conductive ground plane member 16 may comprise any flexible, relatively thin electrically conductive element(s) or member(s), such as but not limited to any deformable conductive material film, foil or the conductive or semiconductor materials/configurations discussed above with respect to the antenna element 12.

As shown in the exemplary illustrated embodiment in FIGS. 2 and 3, in some embodiments the ground plane member 16 may comprise a flexible thin sheet or patch of metal material (e.g., copper) that is coupled to or mounted on the second side 27 of the flexible heterogeneous substrate

20. In some other embodiments, the ground plane member 16 may comprise a two-dimensional array of conductive material (of one or more shapes). The ground plane member 16 may comprise any shape (such as the potential shapes of the antenna element 12 discussed above).

In some embodiments, the flexible ground plane member 16 may correspond to the shape of the flexible heterogeneous substrate 20 and/or the shape/layout and position of the antenna element 12. In some embodiments, the ground plane member 16 may cover the entirety or a portion of the area of the second side 27 of the flexible heterogeneous substrate 20. In some embodiments, the flexible ground plane member 16 may extend over at least the majority of the surface area of the second side 27 of the substrate 20, as shown in FIG. 2.

In some embodiments, the flexible ground plane member 16 may be centered on the second side 27 of the flexible heterogeneous substrate 20 and/or aligned with the position of the antenna element 12 on the first side 25 of the flexible heterogeneous substrate 20. In some embodiments, the flexible ground plane member 16 may extend past the antenna element 12 along the width W1 and/or length L1 directions by about 2-3 times the height/thickness of the flexible heterogeneous substrate 20 (e.g., so as not to be a finite ground antenna).

However, the size, position and/or shape of the flexible ground plane member 16 may vary, and may depend, at least in part, on the type and/or design of the antenna element 12, which will determine antenna radiation pattern and/or polarization, for example. The ground plane member 16 may be flexible such that it conforms to the natural or neutral shape of the second side 27 of the flexible heterogeneous substrate 20. In some embodiments, in a natural or neutral state of the antenna assembly 10, as shown in FIGS. 1-3, the flexible ground plane member 16 may be planar or flat.

The flexible ground plane member 16 may be formed, at least in part, of one or more electrically conductive material (e.g., a metal) or semiconductor material, such as a metal material (e.g., copper) or a material disclosed above with respect to the material(s) of the antenna element 12. The flexible ground plane member 16 may be directly or indirectly coupled to the second side 27 of the substrate 20. For example, the flexible ground plane member 16 may be affixed to the second side 27 of the substrate 20 via a flexible adhesive (e.g., a flexible epoxy).

The flexible ground plane member 16 may be relatively thin (in a thickness direction extending along a direction extending between the first and second sides 25, 27 of the substrate 20), such as being thinner than the thickness of the substrate 20. For example, in some embodiments the maximum thickness of the flexible ground plane member 16 may be less than about 2 mm, or less than about 1 mm, or less than about ½ mm, or less than about ¼ mm.

In some embodiments, thickness of the ground plane member 16 (and potentially the antenna element 12) is dependent on the skin depth, such as the thickness thereof being within the range of about 3-5 times the skin depth. The skin depth is dependent, at least in part, on the resonant frequency or frequency of operation of the antenna assembly 10, which may vary depending upon the configuration and/or application of a specific antenna assembly 10.

Figure 5:
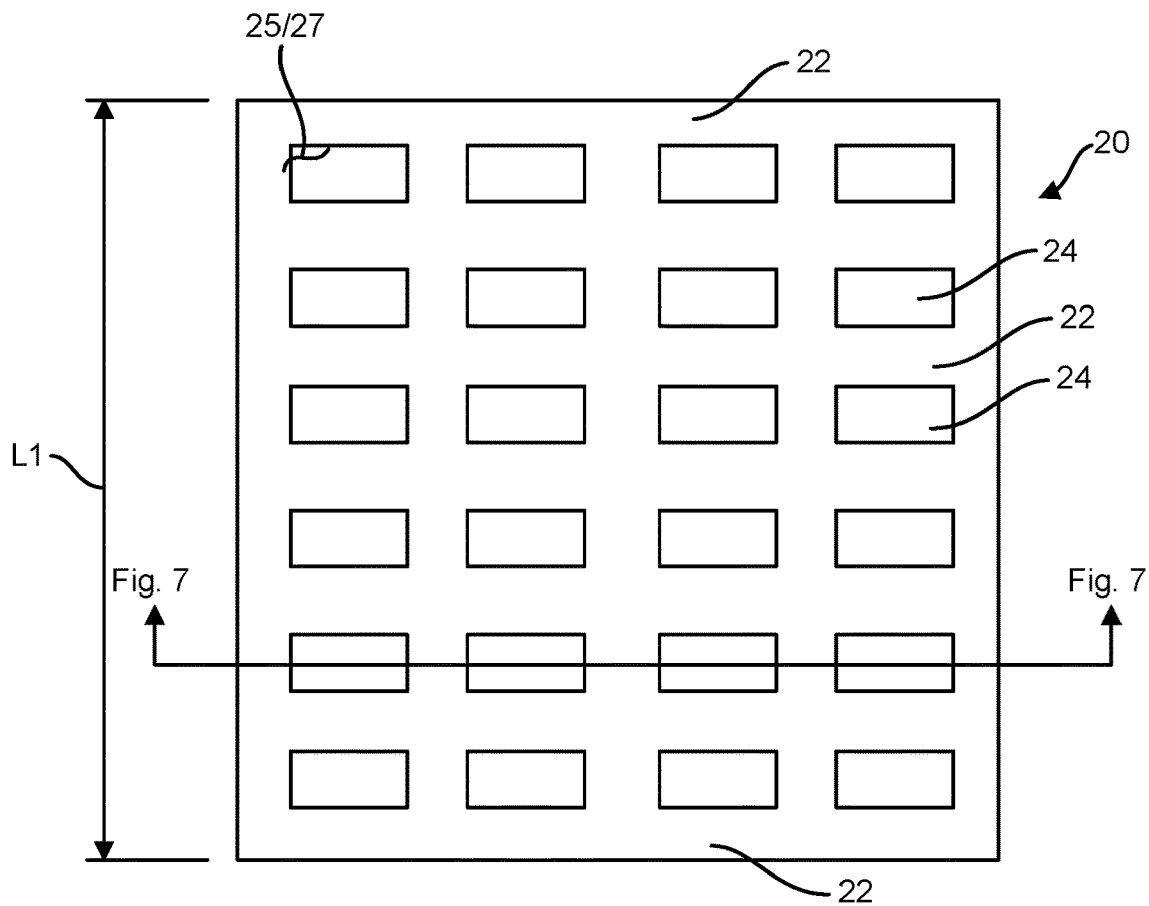
FIG. 5 illustrates a top view of an exemplary embodiment of a flexible heterogeneous substrate of the flexible RF antenna assembly of FIG. 1.
Figure 6:
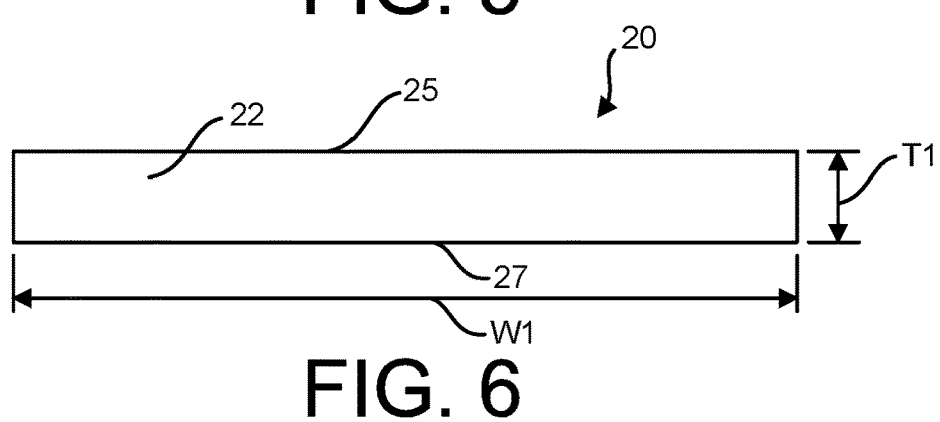
FIG. 6 illustrates a side view of the flexible substrate of FIG. 5.
Figure 7:
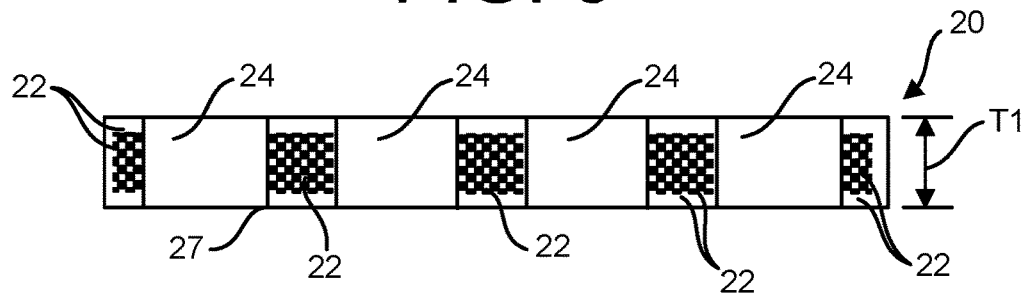
FIG. 7 illustrates a side cross-sectional view of the flexible substrate of FIG. 5.

As shown in FIGS. 5-7, the physical dimensions of the flexible heterogeneous substrate 20 (e.g., one or more dielectric materials) may be larger than the flexible antenna element 12 and the flexible ground plane member 16 (e.g., the width, length and/or thickness of the substrate 20 may be larger than that of the flexible antenna element 12 and/or the flexible ground plane member 16).

The size, shape and configuration of the flexible heterogeneous substrate 20 may vary, and may be configured for a particular physical application and/or to provide/include a particular RF performance/metric (e.g., dielectric constant, resistivity (surface and/or volume), loss tangent, magnetic relative permeability, or a combination thereof) and/or to provide/include a particular flexibility (e.g., Young's modulus/tensile modulus/modulus of elasticity, ultimate tensile strength, yield tensile strength, or a combination thereof) of the flexible heterogeneous substrate 20 and the RF antenna assembly 10 as a whole.

In some embodiments, the maximum thickness T1 of the flexible heterogeneous substrate 20 extending between the first and second surfaces or sides 25, 27 of the substrate 20, as shown in FIG. 6, may be less than 10 mm, or within the range of about 0.4 mm to about 10 mm, or within the range of about 1 mm to about 5 mm. However, the flexible heterogeneous substrate 20 may be of any thickness.

The thickness of the flexible heterogeneous substrate 20 may vary along the width and/or length thereof, or the substrate 20 may be of a constant thickness T1. The maximum thickness T1 of the flexible heterogeneous substrate 20 may be defined by the flexible framework portion 22, the interior portions 24 or a combination thereof. For example, at least a portion of the exposed surfaces of the flexible framework portion 22 and/or the interior portions 24 at the first side 25 of the substrate 20 may be coplanar or even, or one of the flexible framework portion 22 and the interior portions 24 may extend past the other.

Similarly, at least a portion of the exposed surface of at least one of the flexible framework portion 22 and the interior portions 24 at the second side 27 of the flexible heterogeneous substrate 20 may be coplanar or even, or one of the flexible framework portion 22 and the interior portions 24 may extend past the other.

In some embodiments, both the framework portion 22 and the interior portions 24 may be exposed at the first side 25 of the substrate 20 and/or the second side 27 of the substrate 20. In some other embodiments, at least a portion of at least one of the interior portions 24 may not be exposed at least one of the first and second surfaces or sides 25, 27 of the substrate 20 (i.e., the framework portion 22 may extend over at least a portion of at least one of the interior portions 24 at the first and second surfaces or sides 25, 27). In some embodiments, the framework portion 22 may extend fully about (i.e., encapsulate) at least one (or all) of the interior portions 24.

As shown in FIGS. 5-7, the flexible framework portion 22 of the flexible heterogeneous substrate 20 may extend fully about the periphery of a portion of each of the plurality of distinct interior portions 24 such that the framework portion 22 forms the entirety of the peripheral sides, edges or extent of the substrate 20 along the width W1 and length L1 directions. However, in alternative embodiments (not shown), at least one interior portion 24 may define at least a portion of an outer side or edge of the substrate 20 along the width W1 and length L1 directions.

As the flexible framework portion 22 may extend fully about at least a portion of each interior portion 24, the flexible framework portion 22 may extend between adjacent interior portions 24, as shown in FIGS. 5 and 7. The amount (e.g., height or thickness) of the flexible framework portion 22 extending between the periphery of the substrate 20 and an adjacent interior portion 24, and between neighboring or adjacent interior portions 24, 24, may be varied based on the physical requirement/configuration (e.g., flexibility and/or moisture absorption) and/or the RF performance requirements/configuration (e.g., loss tangent, relative permittivity, resistivity (surface and/or volume/thickness resistivity), magnetic relative permeability, or a combination thereof) associated with the use of the antenna assembly 10.

Similarly, the size, shape, number and/or arrangement of the interior portions 24 may be varied based on the physical requirements/configuration (e.g., flexibility and/or moisture absorption) and/or the RF performance requirements/configuration (e.g., loss tangent, relative permittivity, resistivity (surface and/or volume/thickness resistivity), magnetic relative permeability, or a combination thereof) associated with the use of the antenna assembly 10.

The flexible framework portion 22 may be bonded or adhered to the interior portions 24, or alternatively may be physically configured to physically retain the interior portions 24, within cavities, gaps or spaces of the framework portion 22.

The framework portion 22 may be substantially flexible such that the antenna assembly 10, as a whole, is relatively flexible so that it can be utilized in applications with arbitrarily shaped static surfaces and/or moving portions or components, such as in wearable applications. In some embodiments, the framework portion 22 is formed of one or more polymer. In some embodiments, the framework portion 22 is formed or comprised of one or more flexible thermoplastic elastomer, such as a thermoplastic polyurethane.

In some such embodiments, the framework portion 22 may be formed (at least in part) of a thermoplastic polyurethane and a rubber. The material composition of the framework portion 22 may comprise a single material or a combination of materials. When comprised of two or more materials, the materials may be blended or mixed together (homogeneously or non-homogeneously), or may define singe-material layers or portions within the framework portion 22.

The framework portion 22 may be relatively flexible, and may provide or dictate, at least in part the flexibility of the heterogeneous substrate 20 and the assembly 12. In some embodiments, the framework portion 22 (and/or the material or materials forming the framework portion 22) may comprise a Young's Modulus (E) of less than or equal to 0.1 Gpa, or less than or equal to 0.08 Gpa, or less than or equal to 0.05 Gpa, or less than or equal to 0.03 Gpa, or less than or equal to 22 Mpa, or less than or equal to 20 Mpa, or less than or equal to 18 Mpa, or less than or equal to 16 Mpa, or less than or equal to 15 Mpa, or less than or equal to 14 Mpa, or less than or equal to 13 Mpa.

In some embodiments, the framework portion 22 (and/or the material or materials forming the framework portion 22) may comprise an ultimate tensile strength ($\sigma_u/\sigma_{ts}$) of less than or equal to 40 Mpa, or less than or equal to 38 Mpa, or less than or equal to 36 Mpa, or less than or equal to 34 Mpa, or less than or equal to 32 Mpa, or less than or equal to 30 Mpa. In some embodiments, the framework portion 22 (and/or the material or materials forming the framework portion 22) may comprise a yield tensile strength ($\sigma_y$) of less than or equal to 12 Mpa, or less than or equal to 10 Mpa, or less than or equal to 9 Mpa, or less than or equal to 8 Mpa, or less than or equal to 7 Mpa, or less than or equal to 6 Mpa or less than or equal to 5 Mpa.

In some embodiments, the framework portion 22 (and/or the material or materials forming the framework portion 22) may comprise a moisture absorption (24 hours) of less than or equal to 2%, or less than or equal to 1.8%, or less than or equal to 1.6%, or less than or equal to 1.4%, or less than or equal to 1.2%, or less than or equal to 1%, or less than or equal to 0.8%, or less than or equal to 0.6%, or less than or equal to 0.5%, or less than or equal to 0.4%, or less than or equal to 0.3%.

In some embodiments, the framework portion 22 and/or the material composition of the framework portion 22 (e.g., a thermoplastic polyurethane material forming the entirety thereof) may include at least one of a specific gravity within the range of about 0.8 g/cc to about 1.5 g/cc according to ASTM D792), a moisture absorption (24 hours) within the range of about 0.16% and about 0.28% (according to ASTM D570), a tensile strength (yield) within the range of about 435 psi to about 725 psi (according to ASTM D638), a tensile strength (ultimate) within the range of about 2,775 psi to about 4,625 psi (according to ASTM D638), a Young's modulus/tensile modulus within the range of about 1,350 psi to about 2,250 psi (according to ASTM D638), an elongation at yield within the range of 48% to about 81% (according to ASTM D638), an elongation at break within the range of 495% to about 825% (according to ASTM D638), a toughness (integrates stress-strain curve; calculated stress×strain) of 9,000 (in×lbF)/in$^3$ to about 15,000 (in×lbF)/in$^3$ (according to ASTM D638), a hardness of about 63 Shore A to about 106 Shore A (according to ASTM D2240), an impact strength (notched Izod, 23C) of about 1.5 (ft×lbf)/in$^2$ to about 2.5 (ft×lbf)/in$^2$ (according to ASTM D256), an abrasion resistance (mass loss, 10,000 cycles) within the range of about 0.06 g to about 0.1 g (according to ASTM D4060), or a combination thereof.

In some embodiments, the framework portion 22 and/or the material composition of the framework portion 22 (e.g., a thermoplastic polyurethane material forming the entirety thereof) may include at least one of a specific gravity within the range of about 1 g/cc to about 1.3 g/cc according to ASTM D792), a moisture absorption (24 hours) within the range of about 0.19% and about 0.2% (according to ASTM D570) a tensile strength (yield) within the range of about 522 psi to about 638 psi (according to ASTM D638), a tensile strength (ultimate) within the range of about 3,330 psi to about 4,070 psi (according to ASTM D638), a tensile modulus within the range of about 1,620 psi to about 1,980 psi (according to ASTM D638), an elongation at yield within the range of 58% to about 72% (according to ASTM D638), an elongation at break within the range of 594% to about 726% (according to ASTM D638), a toughness (integrates stress-strain curve; calculated stress×strain) of 10,800 (in×lbF)/in$^3$ to about 13,200 (in×lbF)/in$^3$ (according to ASTM D638), a hardness of about 77 Shore A to about 94 Shore A (according to ASTM D2240), an impact strength (notched Izod, 23C) of about 1.8 (ft×lbf)/in$^2$ to about 2.2 (ft×lbf)/in$^2$ (according to ASTM D256), an abrasion resistance (mass loss, 10,000 cycles) within the range of about 0.07 g to about 0.09 g (according to ASTM D4060), or a combination thereof.

In one embodiment, the framework portion 22 is formed entirely of a thermoplastic polyurethane material, and the framework portion 22 and/or the thermoplastic polyurethane material include at least one of a specific gravity of about 1.2 g/cc according to ASTM D792), a moisture absorption (24 hours) of about 0.22% (according to ASTM D570), a tensile strength (yield) of about 580 psi (according to ASTM D638), a tensile strength (ultimate) of about 3,700 psi (according to ASTM D638), a tensile modulus of about 1,800 psi (according to ASTM D638), an elongation at yield of about 65% (according to ASTM D638), an elongation at break of about 660% (according to ASTM D638), a toughness (integrates stress-strain curve; calculated stress×strain) of about 12,000 (in×lbF)/in$^3$ (according to ASTM D638), a hardness of about 85 Shore A (according to ASTM D2240), an impact strength (notched Izod, 23C) of about 2 (ft×lbf)/in$^2$ (according to ASTM D256), an abrasion resistance (mass loss, 10,000 cycles) of about 0.08 g (according to ASTM D4060), or a combination thereof. In one exemplary embodiment, the framework portion 22 is formed entirely of NinjaFlex® thermoplastic elastomer sold by Fenner Drives, Inc. of Manheim, Pa.

In one embodiment, the framework portion 22 is formed entirely of a thermoplastic polyurethane material disclosed in International PCT Patent Application No. PCT/US2015/063788 filed on Dec. 3, 2015 by Fenner U.S., Inc. entitled Improved Filament for Fused Deposit Modeling and/or U.S. patent application Ser. No. 14/495,491 filed on Sep. 24, 2014 by Stephen F. Heston et al. entitled Filament for Fused Deposit Modeling, the entireties of which are hereby expressly incorporated herein by reference in their entireties.

As discussed above, the size, shape, number, arrangement/layout and/or material composition, for example, of the discrete interior portions 24 may be varied based on the physical requirements/configuration (e.g., flexibility) and/or the RF performance requirements/configuration (loss tangent, bandwidth, relative permittivity, magnetic permeability, surface resistivity, volume resistivity, etc.) associated with a particular RF application or RF device (e.g., a particular application or use of the antenna assembly 10).

For example, increasing the total area or volume of the interior portions 24 in the substrate 20 may increase RF performance of the antenna assembly 10, but may decrease the mechanical flexibility of the substrate 20 (and thus the antenna assembly 10 as a whole). Conversely, decreasing the total area or volume of the interior portions 24 in the substrate 20 may increase the mechanical flexibility of the substrate 20 (and thus the antenna assembly 10), but may decrease the RF performance of the antenna assembly 10 (due to the material of the framework portion 22, as discussed below).

As shown in FIG. 2, the discrete interior portions 24 may be rectangular shaped and arranged in a symmetrical pattern or array (along the width W1 and length L1 directions). A plurality of the (rectangular) discrete interior portions 24 may thereby be aligned and spaced evenly or symmetrically across the width W1 and length L1 directions of the substrate.

However, the discrete interior portions 24 may be of any shape and arranged in any pattern or layout. Similarly, a substrate 20 may include discrete interior portions 24 the same shapes and sizes, or include discrete interior portions 24 of differing shapes and/or sizes. For example, the discrete interior portions 24 may be of a circular shape, an elliptical shape, a 'T' shape, an 'H' shape, an 'I' shape, a 'V' shape, an 'X' shape, a line shape, a '=' shape, a parallel lines shape, a '+' shape, an intersecting lines shape, a '#' shape, a lattice shape, an asterisk shape, or a polygonal shape, for example.

As another example, polygonal shaped discrete interior portions 24 may be of a regular polygonal shape, a simple polygonal shape, an equilateral polygonal shape, an equiangular polygonal shape, a convex polygonal shape, a concave polygonal shape, an isogonal polygonal shape, a triangular shape, a quadrilateral shape, a tetragonal shape, a rectangular shape, a square shape, a rhombus shape, a pentagonal shape, a hexagonal shape, a heptagonal shape, an octagonal shape, a nonagonal shape, or a decagonal shape.

The discrete interior portions 24 may be formed of one or more materials, such as but not limited to one or more polymer material. For example, the discrete interior portions 24 may be formed entirely of a single material, such as a single polymer material or other type of material. In some other embodiments, one or more of the discrete interior portions 24 may be formed from a combination of two or more materials, such as two or more materials being blended or mixed together (homogeneously or non-homogeneously) or two or more discrete differing material portions within a particular discrete interior portion 24.

For example, a discrete interior portion 24 may comprise discrete layers of differing materials (and/or of the framework portion 22) stacked or overlying each other (at least partially) in the thickness T1 direction, and/or discrete layers or portions of differing materials arranged adjacent each other (at least partially) along the width W1 and/or length L1 directions. Further, differing discrete interior portions 24 may include different material compositions, and differing substrates 20 may include discrete interior portions 24 of different material compositions.

In some embodiments, the discrete interior portions 24 may be formed of ASA, PC, ABS, PC-ABS, ABSi, PLA, soft PLA, HIPS, PVA, polyamides, polyimides, Nylon, Nylon 6/6, PET, PETT, TPE, LDPE, PTFE, PS, PMMA, PVC, POM, PBT, PPO, PA, PI, PAI, PEI, PSU, PEEK or any combination thereof.

In some embodiments, at least a portion of at least one of the plurality of discrete interior portions 24 may be solid. In some embodiments, at least a portion of at least one of the plurality of discrete interior portions 24 may be a fluid or a dispersion (e.g., a gel).

At least one of the plurality of discrete interior portions 24 may comprise a single integral structure or a plurality of discrete non-coupled or bonded structures (e.g., a plurality of discrete non-coupled members (e.g., polymer members) or a powder).

In some embodiments, the at least one of the plurality of discrete interior portions 24 may be formed of a low-k material, a high-k material, a high loss tangent material, low loss tangent material, electrically conductive material, semiconductor material, non-conductive (i.e., insulative) material, magnetic material, non-magnetic material or any combination thereof.

As discussed above, each of the discrete interior portions 24 may include one or more electrical properties that differ from than of the framework portion 22. In some embodiments, the discrete interior portions 24 (and potentially the framework portion 22) (and/or the material compositions thereof) may have a dielectric constant that is within the range of about 1 to about 200, or within the range of about 1 to about 9. In some embodiments, the discrete interior portions 24 (and potentially the framework portion 22) (and/or the material compositions thereof) may have a loss tangent or dissipation factor that is within the range of about 0.0001 to about 0.1, or within the range of about 0.001 to about 0.06.

In some embodiments, the discrete interior portions 24 (and potentially the framework portion 22) (and/or the material compositions thereof) may have a surface resistivity (width W1 and length L1 volume resistivity) that is greater than zero but less than or equal to about 10^20 ohm-cm, or fully lacks a surface resistivity (i.e., a surface resistivity of 0).

In some embodiments, the discrete interior portions 24 (and/or the framework portion 22) (and/or the material compositions thereof) may have a volume thickness resistivity (thickness T1 volume resistivity) that is greater than zero but less than or equal to about 10^20 ohm-cm, or fully lacks a volume thickness resistivity (i.e., a volume thickness resistivity of 0).

In some embodiments, the discrete interior portions 24 (and/or the framework portion 22) (and/or the material compositions thereof) may have a magnetic relative permeability that is greater than zero but less than or equal to about 1,000, or within the range of about 5 to about 10, or fully lacks a magnetic relative permeability (i.e., a magnetic relative permeability of 0).

The discrete interior portions 24 (and/or the framework portion 22) may be completely solid (i.e., a 100% infill density), or be formed with internal air spaces or pockets (i.e., an infill density less than 100%) of defined or pre-defined shapes and sizes. For example, the discrete interior portions 24 (and/or the framework portion 22) may include an infill density of less than 100% and internal air spaces of a defined or pre-defined grid shape/arrangement, a line shape/arrangement, a triangular shape/arrangement, a tri-hexagon shape/arrangement, a cubic shape/arrangement, a octet shape/arrangement, a concentric or concentric 3-D shape/arrangement, a zig-zag shape/arrangement, a cross or cross-3-D shape/arrangement, etc.

In some embodiments, the discrete interior portions 24 may include an infill density within the range of about 30% to about 100%, or about 80% to about 100%. Similarly, the framework portion 22 may be completely solid (i.e., a 100% infill density), or be formed with internal air spaces or pockets. For example, the framework portion 22 may include an infill density within the range of about 30% to about 100%, or about 40% to about 70%. In some embodiments, the infill density of the discrete interior portions 24 is greater than the infill density of the framework portion 22. For example, in the illustrated embodiment the framework portion 22 includes an infill density of about 50%, and the discrete interior portions 24 are solid (i.e., include a 100% infill density), as shown in FIG. 7. As also shown in FIG. 7, the air spaces or pockets within the framework portion 22 may be spaced from the first and second sides 25, 27 of the substrate 20 (and potentially the sides surfaces extending therebetween) (i.e., the portions of the framework portion 22 that are adjacent to the first and second sides 25, 27 are solid (i.e., include a 100% infill density).

The RF performance or properties of the material of the framework portion 22 (i.e., the material forming the entirety thereof) may not be advantageous for RF frequencies or for a particular RF application/device. For example, the material forming the framework portion 22 (e.g., a thermoplastic polyurethane material) (and/or the framework portion 22 itself) may include a relative permittivity within the range of about 2.2 to about 3.7 and tangential loss within the range of about 0.04 to about 0.08 at 2.4 GHz at a 100% infill density, or a relative permittivity within the range of about 2.6 and about 3.3 and tangential loss within the range of about 0.05 and about 0.07 at 2.4 GHz at a 100% infill density. In one exemplary embodiment, the framework portion 22 is formed entirely from a thermoplastic polyurethane material with a relative permittivity of about 2.9 and tangential loss of about 0.06 at 2.4 GHz at a 100% infill density. In some embodiments, the framework portion 22 may include a dielectric constant that is not well suited to a particular RF application/device, such as a dielectric constant within the range of about 1 to about 4, or within the range of about 2 and about 3, or within the range of about 2.2 and about 3. In some embodiments, the framework portion 22 may include a loss tangent that is not well suited to a particular RF application/device, such as a loss tangent within the range of about 0.02 to about 0.08, or within the range of about 0.03 and about 0.05, or within the range of about 0.04 and about 0.06. In one exemplary embodiment, the framework portion 22 is formed entirely from a thermoplastic polyurethane material with a dielectric constant of about 3 and/or a loss tangent of about 0.06 at a 100% infill density.

However, the RF performance or properties of the material of the interior portions 24 (i.e., the material forming the entirety thereof) may be advantageous for RF frequencies. For example, the material forming the entirety of the interior portions 24 (e.g., one or more polymer materials) (and/or the interior portions 24 themselves) may include a relative permittivity within the range of about 2 to about 3 and a tangential loss within the range of about 0.04 to about 0.06 at 2.4 GHz at a 100% infill density, or a relative permittivity within the range of about 2.7 and about 2.9 and tangential loss within the range of about 0.05 and about 0.06 at 2.4 GHz at a 100% infill density.

In one exemplary embodiment, the interior portions 24 are formed entirely from a polymer material (e.g., ABS) with a relative permittivity of about 2.35 and tangential loss of about 0.007 at 2.4 GHz at a 100% infill density. As such, at 100% infill density, the interior portions 24 may include a dielectric constant that is well suited to RF applications, such as a dielectric constant within the range of about 1 to about 200, or within the range of about 1 and about 20. In one exemplary embodiment, the interior portions 24 are formed entirely from a polymer (e.g., ABS) with a dielectric constant of about 2, or within the range of about 2.2 to about 2.5 (e.g., about 2.35) at a 100% infill density.

In some embodiments, the relative infill density of the flexible framework portion 22 and the discrete interior portions 24 are configured such that the dielectric constants thereof are within about 25%, or within about 10%, or within about 5%, or within about 2%, or within about 1% of each other. For example, in some embodiments the flexible framework portion 22 is formed of a thermoplastic polyurethane material with about 100% infill density, and the discrete interior portions 24 are formed of a polymer (e.g., ABS) with about 50% infill density, such that the dielectric constants thereof are within 5%, or within about 2%, or within about 1% of each other (e.g., dielectric constants of about 2.5). In such embodiments, the total volume or area of the interior portions 24 within the substrate 20 as compared to the framework portion 22 can be varied to vary the RF performance of the antenna assembly 10 without (effectively or substantially) effecting the dielectric constant of thereof. For example, in such embodiments, the loss tangent of the substrate 20, as a whole, and thereby the bandwidth and gain of the antenna assembly 10, can be tuned by varying the percentage (e.g., volume or are percentage) of the interior portions 24 to the flexible framework portion 22 in the substrate 20 without (effectively or substantially) effecting the dielectric constant of thereof. In some such embodiments, as the relative percentage of the interior portions 24 within the substrate 20 is increased, the gain of the substrate 20 (and thereby the antenna assembly 10 as a whole) increases and the bandwidth thereof decreases.

As discussed above, the RF properties or performance of the flexible heterogeneous substrate 20 can be configured or selected by, for example, varying the number, size (e.g., volume, area, thickness, etc.), position and/or material composition of the discrete interior portions 24. In some embodiments, at least one of the interior portions 24 may include at least one RF property/metric that differs from another of the interior portions 24, such as at least one of the relative dielectric permittivity (i.e., dielectric constant), loss tangent, surface resistivity, volume/thickness resistivity, magnetic relative permeability or a combination thereof (e.g., by at least 10%, or at least 20%, or at least 30% or at least 50%, or at least 75% or at least 100%, or at least 200%, or at least 500%, or at least 1,000%, or at least 2,000%, or at least 3,000%, or at least 4,000%, or at least 5,000%, or at least 6,000%, or at least 7,000%, or at least 8,000%, or at least 9,000% or at least 10,000%).

Similarly, as the flexible framework portion 22 may include at least one RF property/metric that may be disadvantageous or may not meet design criteria of one or more particular RF applications or devices, at least one of the interior portions 24 (e.g., one of the interior portions 24, a portion of the interior portions 24, or all of the interior portions 24, for example) may include at least one RF property/metric that differs from that of the framework portion 22, such as at least one of the relative dielectric permittivity (i.e., dielectric constant), loss tangent, surface resistivity, volume/thickness resistivity, magnetic relative permeability or a combination thereof. In some such embodiments, at least one of the relative dielectric permittivity (i.e., dielectric constant), loss tangent, surface resistivity, volume/thickness resistivity, magnetic relative permeability or a combination thereof of at least one of the interior portions 24 may be at least 5%, 10%, 15%, 20%, 25%, 30%, 35%, 40%, 45%, 50%, 55%, 60%, 65%, 70%, 75%, 80%, 85%, 90%, 90%, 100%, 125%, 150%, 175%, 200%, 250%, 300%, 400%, 500%, 600%, 700%, 800%, 900%, 1,000%, 1,500%, 2,000%, 3,000%, 4,000%, 5,000%, 6,000%, 7,000%, 8,000%, 9,000% or 10,000% greater or less than that of the framework portion 22.

In some embodiments, the relative dielectric permittivity (i.e., dielectric constant) of at least one of the interior portions 24 may be at least 5%, 10%, 15%, 20%, 25%, 30%, 35%, 40%, 45%, 50%, 55%, 60%, 65%, 70%, 75%, 80%, 85%, 90%, 90%, 100%, 125%, 150%, 175%, 200%, 250%, 300%, 400%, 500%, 600%, 700%, 800%, 900%, 1,000%, 1,500%, 2,000%, 3,000%, 4,000%, 5,000%, 6,000%, 7,000%, 8,000%, 9,000% or 10,000% greater or less than that of the framework portion 22.

In some embodiments, the loss tangent of at least one of the interior portions 24 may be at least 5%, 10%, 15%, 20%, 25%, 30%, 35%, 40%, 45%, 50%, 55%, 60%, 65%, 70%, 75%, 80%, 85%, 90%, 90%, 100%, 125%, 150%, 175%, 200%, 250%, 300%, 400%, 500%, 600%, 700%, 800%, 900% or 1,000% greater or less than that of the framework portion 22.

In some embodiments, the surface resistivity of at least one of the interior portions 24 may be at least 5%, 10%, 15%, 20%, 25%, 30%, 35%, 40%, 45%, 50%, 55%, 60%, 65%, 70%, 75%, 80%, 85%, 90%, 90%, 100%, 125%, 150%, 175%, 200%, 250%, 300%, 400%, 500%, 600%, 700%, 800%, 900%, 1,000%, 1,500%, 2,000%, 3,000%, 4,000%, 5,000%, 6,000%, 7,000%, 8,000%, 9,000% or 10,000% greater or less than that of the framework portion 22.

In some embodiments, the volume/thickness resistivity of at least one of the interior portions 24 may be at least 5%, 10%, 15%, 20%, 25%, 30%, 35%, 40%, 45%, 50%, 55%, 60%, 65%, 70%, 75%, 80%, 85%, 90%, 90%, 100%, 125%, 150%, 175%, 200%, 250%, 300%, 400%, 500%, 600%, 700%, 800%, 900%, 1,000%, 1,500%, 2,000%, 3,000%, 4,000%, 5,000%, 6,000%, 7,000%, 8,000%, 9,000% or 10,000% greater or less than that of the framework portion 22.

In some embodiments, the magnetic relative permeability of at least one of the interior portions 24 may be at least 5%, 10%, 15%, 20%, 25%, 30%, 35%, 40%, 45%, 50%, 55%, 60%, 65%, 70%, 75%, 80%, 85%, 90%, 90%, 100%, 125%, 150%, 175%, 200%, 250%, 300%, 400%, 500%, 600%, 700%, 800%, 900%, 1,000%, 1,500%, 2,000%, 3,000%, 4,000%, 5,000%, 6,000%, 7,000%, 8,000%, 9,000% or 10,000% greater or less than that of the framework portion 22.

At least one of the interior portions 24 (and/or the material composition thereof, in whole or part) may be relatively inflexible, particularly as compared to the flexibility of the framework portion 22 (and/or the material composition thereof). In some embodiments, the Young's modulus/tensile modulus/modulus of elasticity of at least one of the interior portions 24 (and/or the material composition thereof, in whole or part) may be at least 5%, 10%, 15%, 20%, 25%, 30%, 35%, 40%, 45%, 50%, 55%, 60%, 65%, 70%, 75%, 80%, 85%, 90%, 90%, 100%, 125%, 150%, 175%, 200%, 250%, 300%, 400%, 500%, 600%, 700%, 800%, 900%, 1,000%, 1,500%, 2,000%, 3,000%, 4,000%, 5,000%, 6,000%, 7,000%, 8,000%, 9,000% or 10,000% greater than the Young's modulus/tensile modulus/modulus of elasticity of the framework portion 22 (and/or the material composition thereof).

In some embodiments, the ultimate tensile strength ($\sigma_u/\sigma_{ts}$) of at least one of the interior portions 24 (and/or the material composition thereof, in whole or part) may be at least 5%, 10%, 15%, 20%, 25%, 30%, 35%, 40%, 45%, 50%, 55%, 60%, 65%, 70%, 75%, 80%, 85%, 90%, 90%, 100%, 125%, 150%, 175%, 200%, 250%, 300%, 400%, 500%, 600%, 700%, 800%, 900% or 1,000%, 1,500%, 2,000%, 3,000%, 4,000%, 5,000%, 6,000%, 7,000%, 8,000%, 9,000% or 10,000% greater than the ultimate tensile strength ($\sigma_u/\sigma_{ts}$) of the framework portion 22 (and/or the material composition thereof).

In some embodiments, the yield tensile strength ($\sigma_u/\sigma_{ts}$) of at least one of the interior portions 24 (and/or the material composition thereof, in whole or part) may be at least 5%, 10%, 15%, 20%, 25%, 30%, 35%, 40%, 45%, 50%, 55%, 60%, 65%, 70%, 75%, 80%, 85%, 90%, 90%, 100%, 125%, 150%, 175%, 200%, 250%, 300%, 400%, 500%, 600%, 700%, 800%, 900% or 1,000%, 1,500%, 2,000%, 3,000%, 4,000%, 5,000%, 6,000%, 7,000%, 8,000%, 9,000% or 10,000% greater than the yield tensile strength ($\sigma_u/\sigma_{ts}$) of the framework portion 22 (and/or the material composition thereof).

In some embodiments, the moisture absorption (24 hours) of at least one of the interior portions 24 (and/or the material composition thereof, in whole or part) may be at least 5%, 10%, 15%, 20%, 25%, 30%, 35%, 40%, 45%, 50%, 55%, 60%, 65%, 70%, 75%, 80%, 85%, 90%, 90%, 100%, 125%, 150%, 175%, 200%, 250%, 300%, 400%, 500%, 600%, 700%, 800%, 900% or 1,000%, 1,500%, 2,000%, 3,000%, 4,000%, 5,000%, 6,000%, 7,000%, 8,000%, 9,000% or 10,000% greater or less than the moisture absorption (24 hours) of the framework portion 22 (and/or the material composition thereof).

While the flexible heterogeneous substrate 20 has been described and illustrated herein in connection with an RF antenna, the substrate 20 may equally be employed in any flexible passive and/or low power RF device (e.g., an IoT wearable RF device) and/or any flexible RF circuit that utilize a flexible substrate. For example, the flexible heterogeneous substrate 20 may equally be employed in at least one of an RF antenna, an RF filter, an RF sensor, an RF power divider and an RF detector. The substrate 20 may thereby form part of an assembly that forms, or otherwise be a component of, at least a portion of an RF antenna, an RF filter, an RF sensor, an RF power divider or an RF detector.

Figure 8:
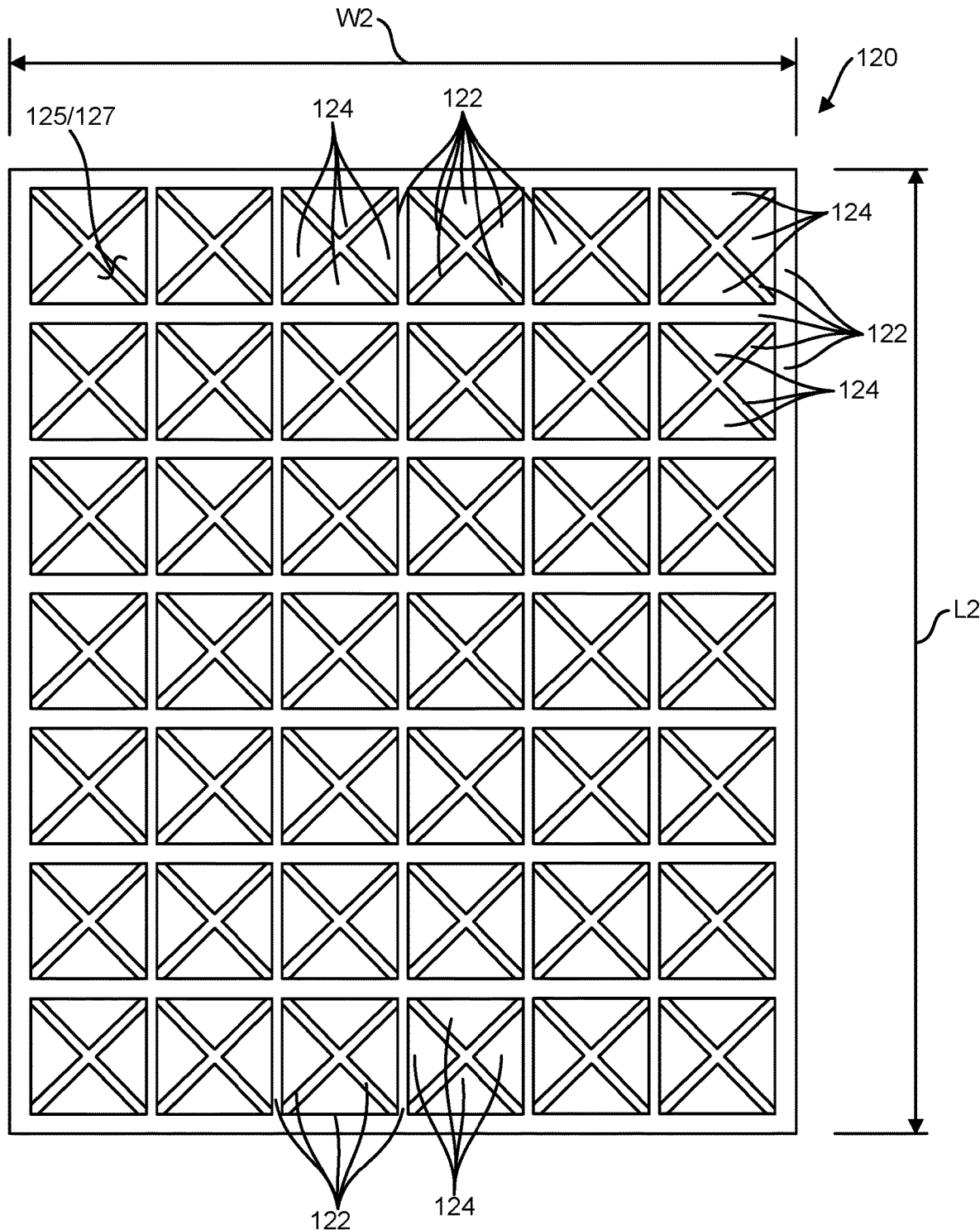
FIG. 8 illustrates a top view of another exemplary embodiment of a flexible heterogeneous substrate for an RF assembly/device according to the present disclosure.

FIG. 8 illustrates another example of a flexible heterogeneous substrate 120 (e.g., one or more dielectric materials) (potentially for a flexible RF antenna assembly (not shown)) according to the present disclosure. The substrate 120 is substantially similar to the substrate 120 of FIGS. 1-7, and therefore like reference numerals preceded with "1" are used to indicate like aspects, portions, processes or functions, and the description above directed thereto (and the alternative embodiments thereof) equally applies to the substrate 120.

As shown in FIG. 8, substrate 120 differs from substrate 20 in the configuration of the flexible framework portion 122 and the discrete interior portions 124. The interior portions 124 are triangular shaped, and sets of four interior portions 124 are arranged into a plurality of exploded square shapes, with the framework portion 122 extending about and between the triangular interior portions 124.

The exploded square shapes are evenly or symmetrically spaced along the width W2 and length L2 of the substrate 120. As the relative percentage of the interior portions 124 within the substrate 120 of FIG. 8 is greater as compared to that of the substrate 20 of FIGS. 1-7, the substrate 120 (and potentially an antenna assembly utilizing the substrate 120) may include a higher gain and/or a lower bandwidth than that of the substrate 20 of FIGS. 1-7 (assuming the same material composition of the framework portion 122 and interior portions 124, for example).

However, as described above, the dielectric constant of the substrate 120 of FIG. 8 may be similar (e.g., within 10%, or 5%) or the same as that of the substrate 20 of FIGS. 1-7 (assuming the same material composition of the framework portion 122 and interior portions 124, for example). Further, as the relative percentage of the flexible framework portion 122 within the substrate 120 of FIG. 8 is greater as compared to that of the substrate 20 of FIGS. 1-7, the substrate 120 (and an antenna assembly utilizing the substrate 200) may be less flexible or conformal as compared thereto (assuming the same material composition of the framework portion 122 and interior portions 124, for example).

Figure 9:
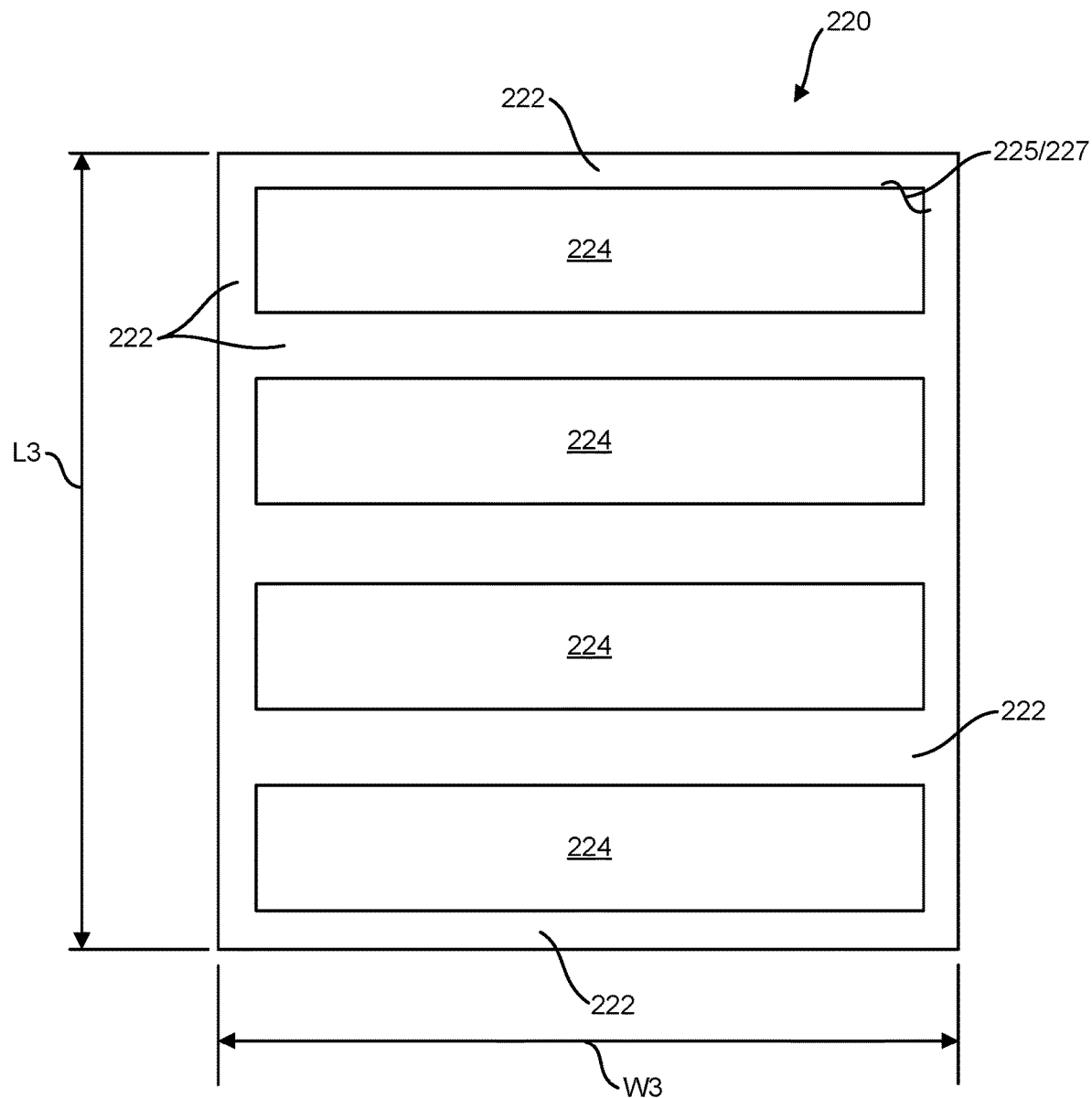
FIG. 9 illustrates a top view of another exemplary embodiment of a flexible heterogeneous substrate for an RF assembly/device according to the present disclosure.

FIG. 9 illustrates another example of a flexible heterogeneous substrate 220 (e.g., one or more dielectric materials) (potentially for a flexible RF antenna assembly (not shown)) according to the present disclosure. The substrate 220 is substantially similar to the substrate 20 of FIGS. 1-7, and the substrate 120 of FIG. 8, and therefore like reference numerals preceded with "2" are used to indicate like aspects, portions, processes or functions, and the description above directed thereto (and the alternative embodiments thereof) equally applies to the substrate 220.

As shown in FIG. 9, substrate 220 differs from substrate 20 and substrate 120 in the configuration of the flexible framework portion 222 and the discrete interior portions 224. The interior portions 224 are rectangular shapes and extend across the majority of the width W3 of the substrate 220, as shown in FIG. 9. As such, only a single row of the interior portions 224 are provide along the width W3 direction.

As shown in FIG. 9, the interior portions 224 are evenly or symmetrically spaced along the length L3 direction. As the relative percentage of the interior portions 224 within the substrate 220 of FIG. 9 is greater as compared to that of the substrate 20 of FIGS. 1-7 and the substrate 120 of FIG. 8, the substrate 220 (and potentially an antenna assembly utilizing the substrate 220) may include a higher gain and a lower bandwidth than that of the substrate 20 of FIGS. 1-7 and the substrate 120 of FIG. 8 (assuming the same material composition of the framework portion 222 and interior portions 224, for example). However, as described above, the dielectric constant of the substrate 220 of FIG. 9 may be similar (e.g., within 10%, or 5%) or the same as that of the substrate 20 of FIGS. 1-7 and the substrate 120 of FIG. 8 (assuming the same material composition of the framework portion 222 and interior portions 224, for example). Further, as the relative percentage of the flexible framework portion 222 within the substrate 220 of FIG. 9 is greater as compared to that of the substrate 20 of FIGS. 1-7 and the substrate 120 of FIG. 8, the substrate 220 (and potentially an antenna assembly utilizing the substrate 220) may be less flexible or conformal as compared thereto (assuming the same material composition of the framework portion 222 and interior portions 224, for example).

Figure 10:
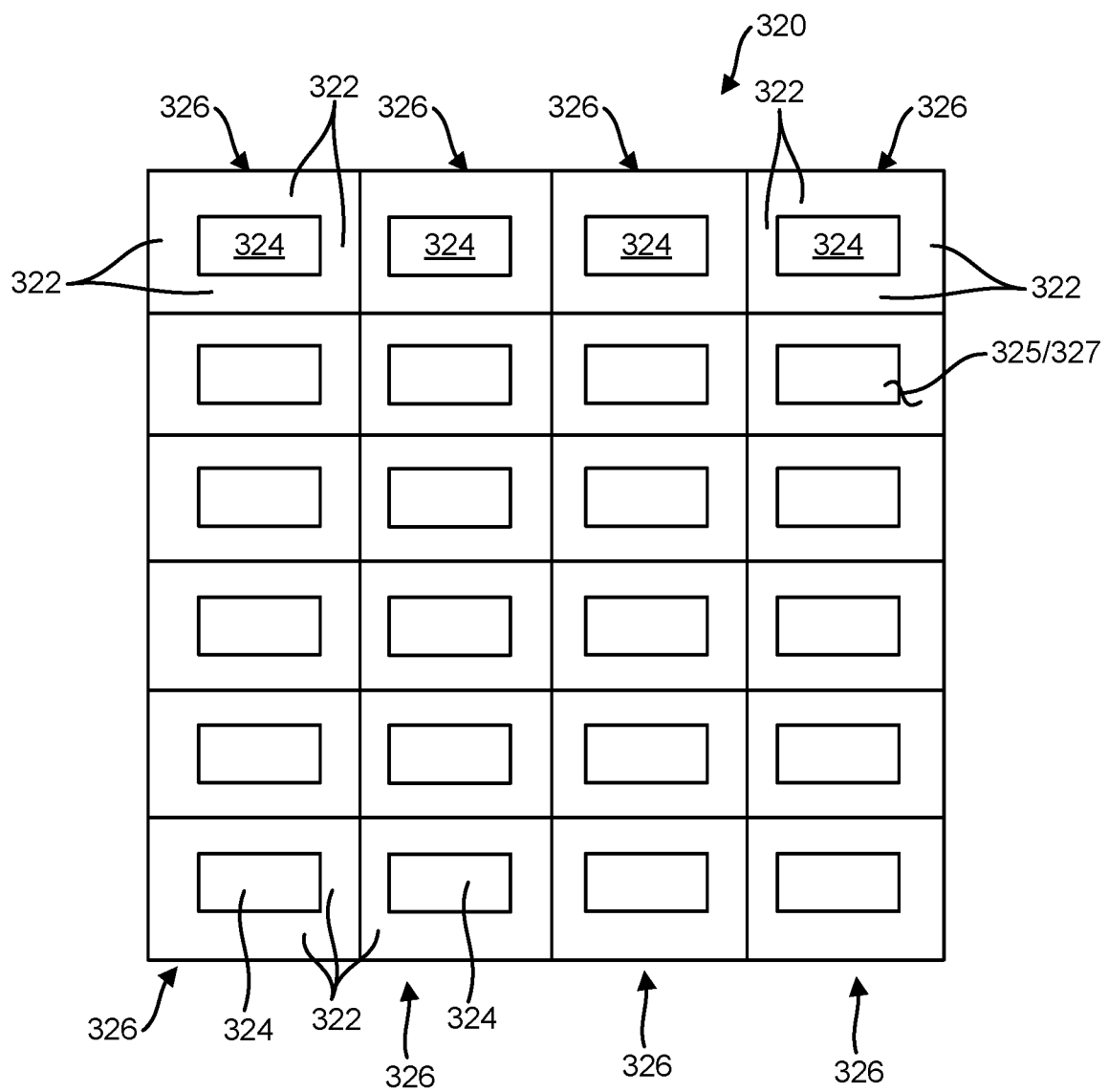
FIG. 10 illustrates a top view of another exemplary embodiment of a flexible heterogeneous substrate for an RF assembly/device that utilizes a plurality of coupled discrete substrate tiles according to the present disclosure.

FIG. 10 illustrates another example of a flexible heterogeneous substrate 320 (potentially for a flexible RF antenna assembly (not shown)) according to the present disclosure. The substrate 320 is substantially similar to the substrate 20 of FIGS. 1-7, the substrate 120 of FIG. 8, and the substrate 220 of FIG. 9, and therefore like reference numerals preceded with "3" are used to indicate like aspects, portions, processes or functions, and the description above directed thereto (and the alternative embodiments thereof) equally applies to the substrate 320.

As shown in FIG. 10, the flexible heterogeneous substrate 320 differs from the flexible heterogeneous substrates 20, 120 and 220 in that substrate 320 is comprised of a plurality of distinct coupled substrate tiles or tile portions 326. In contrast, the framework portions 22, 122, 222 of the flexible heterogeneous substrates 20, 120 and 220 comprise an integral (and potentially one-piece and/or monolithic) structure.

Figure 11:
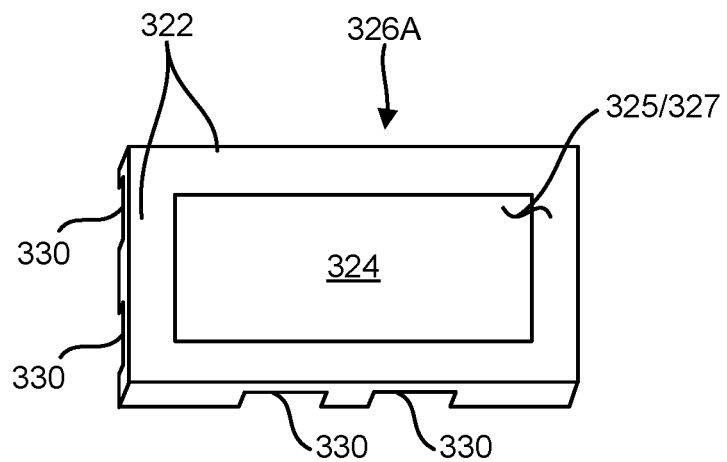
FIG. 11 illustrates an elevational view of a first flexible substrate tile of the flexible heterogeneous substrate of FIG. 10 according to the present disclosure.
Figure 12:
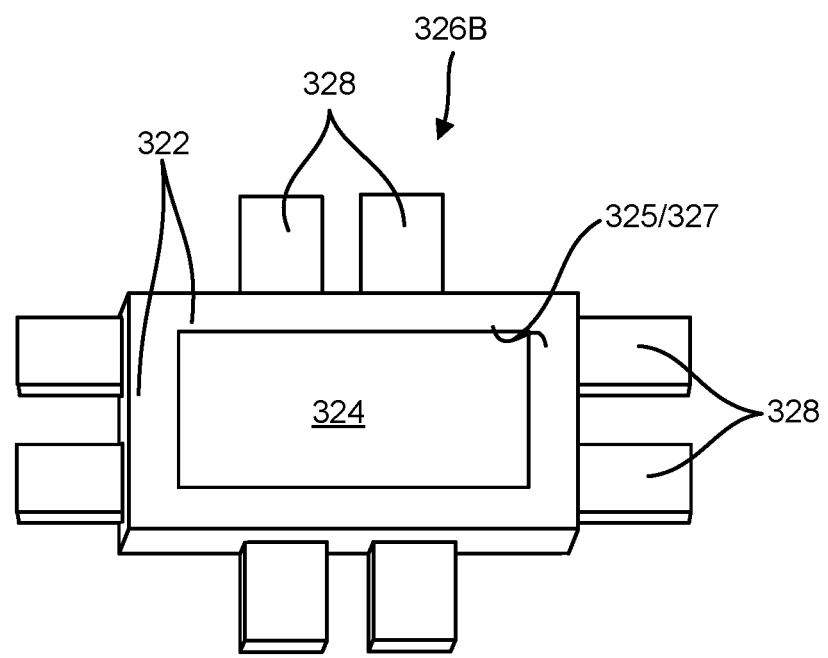
FIG. 12 illustrates a top view of a second flexible substrate tile of the flexible heterogeneous substrate of FIG. 10 according to the present disclosure.

As shown in FIGS. 10-12, each tile 326 may include at least one discrete interior portion 324 and an associated portion of the framework portion 320 that extends about a portion of the respective at least one interior portion 324. In some embodiments, one or more tile portions 326 of the substrate 320 may include a single discrete interior portion 324, as shown in FIGS. 10-12. In some other embodiments, one or more tile portions 326 of the substrate 320 may include a plurality discrete interior portions 324 and the associated portion of the framework portion 322 (not shown). The tiles 326 of the substrate 320 may be equally configured (e.g., identical or substantially similar), or at least one of the tiles 326 of the substrate 320 may differ from at least one other tile 326 of the substrate 320. For example, at least one of the size, shape and/or material composition of the framework portion 322 and/or the at least one discrete interior portion 324 of at least one first tile 326 of the substrate 320 may differ from that of at least one second tile 326 of the substrate 320. In this way, the substrate 20 can be configured with numerous differing mechanical properties/characteristics (e.g., flexibilities, sizes, shapes, etc.) and/or RF properties/characteristics (e.g., dielectric constants, loss tangents, volume resistivities, surface resistivities, magnetic relative permeabilities, etc.) by coupling or utilizing differing tile portions 326 to form the substrate 320.

Figure 13:
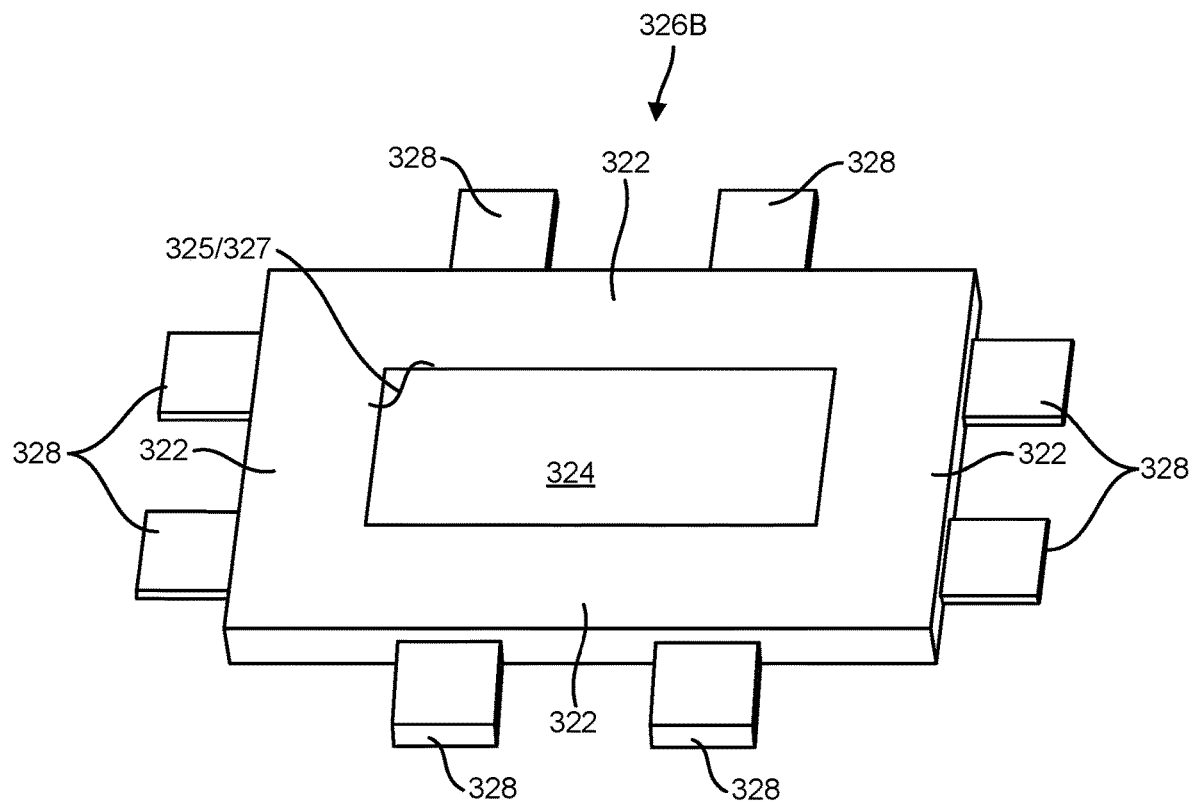
FIG. 13 illustrates an elevational view of the second flexible substrate tile of FIG. 12.

The tile portions 326 may be configured to removably couple together or fixedly couple together. The tiles 326 may be mechanically and/or chemically coupled or bonded together via any mechanism or configuration. In some embodiments, as shown in FIGS. 12 and 13, at least some of the tiles 326 may include at least one projection 328 extending outwardly from lateral sides of the framework portions 322 thereof. The projections 328 may be integral portions of the framework portions 322, or may be coupled thereto. As shown in FIG. 11, at least some of the tiles 326 may include at least one recess, cavity, aperture or the like 330 that are exposed on and extend into a lateral side of the framework portions 322. The at least one recess or cavity 322 may extend into the interior of the framework portion 322 from the top side 325, the bottom side 327 of the tiles 326, a lateral side of the framework portion 322 of the tiles 326 that extends between the top side 325 and the bottom side 327 of the tiles 326, or a combination thereof. The at least one projection 328 of a mating tile 326 may be configured accordingly so as to mate within the at least one recess or cavity 322 and couple the tiles 326 together.

The at least one projection 328 and the at least one recess 330 may be configured to mate such that the at least one projection 328 extends into the at least one recess 330 and couples the tiles 326 together. In some embodiments, the at least one projection 328 and the at least one recess 330 may be configured to form an inference fit or otherwise mechanically lock or couple the tiles 326 together (potentially via a fastener or other component). In some embodiments, the at least one projection 328 and the at least one recess 330 may be adhered or bonded together to lock or couple the tiles 326 together. However, as noted above, the tiles 326 may be removably or fixedly coupled together via any mechanism or configuration.

The flexible heterogeneous substrates (and tiles portion thereof, if included) may be manufactured via any forming process, method or technique that achieves the physical arrangement of the framework portions thereof and the interior portions thereof, the relative flexibilities of the framework portions and the interior portions, and the relative RF properties of the framework portions and the interior portions (e.g., the relative dielectric constants, loss tangents, volume resistivities, surface resistivities and magnetic relative permeabilities).

In some other embodiments, a flexible heterogeneous substrate or a substrate tile according to the present disclosure may be formed, at least in part, via one or more additive manufacturing process. In one embodiment, a flexible heterogeneous substrate (or the tile portions thereof, if included) may be manufactured, at least in part, via a 3-D printing method or process. For example, some embodiments may utilize fused deposition modeling (FDM) 3-D printing to form an integral flexible heterogeneous substrate as disclosed herein, or substrate tiles that couple together to form a flexible heterogeneous substrate as disclosed herein, via a layer-by-layer process. In some such embodiments, a 3-D printer with at least two extraction heads may be utilized to simultaneously print the framework portion via a first material composition and at least one interior portion via a second material composition that differs from the first material composition.

A 3-D printer may be utilized and/or configured to form the flexible heterogeneous substrate (or a tile portion thereof) according to one or more desired mechanical requirements/parameters (e.g., flexibility) and/or RF requirements/parameters (e.g., relative dielectric constant, loss tangent, volume resistivity, a surface resistivity and/or magnetic relative permeability). For example, a 3-D printer may be configured to print the framework portion and/or an interior portion with differing infill densities and/or with varying infill densities along the thicknesses thereof, such as to achieve a particular mechanical and/or RF requirement/parameter. In substrate and tile embodiments that include one or more interior portion with differing material compositions, and/or two or more discrete interior portions with differing material compositions, two or more materials may be changed or switched out in an extruder of a 3-D printer during a print operation so as to form a flexible heterogeneous substrate or a substrate tile portion with three or more differing material compositions.

A variety of 3-D printing techniques may be used at the junction or intersection of the framework portion and an interior portion of a substrate or tile to define the boundary or joint therebetween, such as to ensure the materials thereof are bonded and/or otherwise prevent delamination of the materials during use. For example, a framework portion and an adjacent interior portion may be printed with differing material compositions with a linear joint (at least on the thickness T1 direction) therebetween. In some other embodiments, a framework portion and an adjacent interior portion may be printed with differing material compositions with a non-linear joint (at least on the thickness T1 direction) therebetween, which may be configured to ensure or promote bonding or coupling of the portions together. For example, a 3-D printing stitching, compensation, overlapping and/or splicing technique or methodology may be used at the junction of a framework portion and an adjacent interior portion. Such stitching, compensation, overlapping and/or splicing techniques may form the framework portion and an adjacent interior portion in an overlapping manner or area to "stitch" the portions/materials together and ensure or promote chemical bonding and/or mechanical coupling. It is noted that when adjacent or adjoining portions of a framework portion and an interior portion are printed or extruded simultaneously or within a relatively short time period such that the printed/extruded materials are hotter than their respective melting points and/or softening points, the portions may chemically bond together (e.g., they may become integral).

In some other embodiments, a flexible heterogeneous substrate or a substrate tile according to the present disclosure may be formed, at least in part, via one or more molding technique (e.g., injection molding, blow molding, vacuum molding, extrusion molding, compression molding, gas assist molding, rotational molding, structural molding, thermoforming, etc.). For example, the framework portion and the interior portion(s) of a flexible heterogeneous substrate or substrate tile may be formed, at least in part, via one or more co-molding process. In some other embodiments, a flexible heterogeneous substrate or a substrate tile according to the present disclosure may be formed, at least in part, via one or more casting method. In some other embodiments, a flexible heterogeneous substrate or a substrate tile according to the present disclosure may be formed, at least in part, via one or more lithography method.

In addition, many modifications may be made to adapt a particular aspect, function or material to the teachings of the various embodiments without departing from their scope. While any dimensions and/or types of materials described herein are intended to define the parameters of the various embodiments, they are by no means limiting and are merely exemplary.

Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein."

Moreover, in the following claims, the terms "first," "second," and "third," etc. are used merely as labels, and are not intended to impose numerical requirements on their objects. Also, the terms "coupled", "affixed" or the like are used herein to refer to both connections resulting from separate, distinct components being directly or indirectly coupled together and components being integrally formed (e.g., of one-piece construction or monolithic).

Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment.

Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention.

Additionally, while various embodiments of the invention have been described, it is to be understood that aspects of the disclosure may include only some of the described embodiments, and aspects on one embodiment may equally or similarly be incorporated into any other embodiment. Accordingly, the invention is not to be seen as limited by the foregoing description, but is only limited by the scope of the appended claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art.

Such other examples are intended to be within the scope of the claims if they have structural elements that do not differ from the literal language of the claims, or if they include equivalent structural elements with insubstantial differences from the literal language of the claims.

We claim:

1. A flexible radio frequency (RF) antenna assembly, comprising:
    at least one flexible substrate comprising a first side, a second side opposing the first side, a flexible framework portion and a plurality of discrete spaced interior portions, the framework portion extending fully about at least a portion of each of the discrete spaced interior portions;
    at least one flexible conductive antenna element extending over the first side of the substrate; and
    at least one flexible conductive ground member extending over the second side of the substrate,
    wherein the framework portion comprises a material composition that differs from material compositions of the interior portions,
    wherein the framework portion comprises a flexibility that is greater than flexibilities of at least some of the interior portions,
    wherein each interior portion and the framework portion comprise a dielectric constant, a loss tangent, a volume resistivity, a surface resistivity and a magnetic relative permeability, and wherein at least one of the dielectric constant, the loss tangent, the volume resistivity, the surface resistivity and the magnetic relative permeability of at least one of the interior portions differs from that of the framework portion, and
    wherein the framework portion comprises at least one of a Young's modulus of less than or equal to 16 Mpa, a yield tensile strength of less than or equal to 5 Mpa and an ultimate tensile strength less than or equal to 32 Mpa, and wherein at least some of the plurality of interior portions comprise at least one of a Young's modulus, a yield tensile strength and an ultimate tensile strength that is at least 100% greater than that of the framework portion.

2. The antenna assembly of claim 1, wherein the framework portion comprises a Young's modulus of less than or equal to 16 Mpa, a yield tensile strength of less than or equal to 5 Mpa and an ultimate tensile strength less than or equal to 32 Mpa, and wherein at least some of the plurality of interior portions comprise a Young's modulus, a yield tensile strength and an ultimate tensile strength that is at least 100% greater than that of the framework portion.

3. The antenna assembly of claim 1, wherein the combination of at least two of the dielectric constant, the loss tangent, the volume resistivity, the surface resistivity and the magnetic relative permeability of at least one of the interior portions differs from that of the framework portion.

4. The antenna assembly of claim 1, wherein the dielectric constant of at least one of the interior portions differs from that of the framework portion, wherein the loss tangent of at least one of the interior portions differs from that of the framework portion, wherein the volume resistivity of at least one of the interior portions differs from that of the framework portion, wherein the surface resistivity of at least one of the interior portions differs from that of the framework portion, and wherein the magnetic relative permeability of at least one of the interior portions differs from that of the framework portion.

5. The antenna assembly of claim 1, wherein at least one of the dielectric constant, the loss tangent, the volume resistivity, the surface resistivity and the magnetic relative permeability of at least one interior portion of the plurality of interior portions differs from that of at least one other interior portion of the plurality of interior portions.

6. The antenna assembly of claim 1, wherein the dielectric constant, the loss tangent, the volume resistivity, the surface resistivity and the magnetic relative permeability of at least one of the interior portions differs from that of the framework portion.

7. The antenna assembly of claim 1, wherein at least one of the dielectric constant, the loss tangent, the volume resistivity, the surface resistivity and the magnetic relative permeability of each of the interior portions differs from that of the framework portion.

8. The antenna assembly of claim 1, wherein the framework portion is formed of a flexible polymer.

9. The antenna assembly of claim 8, wherein the flexible polymer is a thermoplastic polyurethane.

10. The antenna assembly of claim 1, wherein the framework portion includes an infill density within the range of about 30% to about 100%.

11. The antenna assembly of claim 1, wherein the polymer of the interior portions comprises ASA, PC, ABS, PC-ABS, ABSi, PLA, soft PLA, HIPS, PVA, polyamides, polyimides, Nylon, Nylon 6/6, PET, PETT, TPE, LDPE, PTFE, PS, PMMA, PVC, POM, PBT, PPO, PA, PI, PAI, PEI, PSU, PEEK or any combination thereof.

12. The antenna assembly of claim 1, wherein the material compositions of the interior portions comprise a polymer, a powder, a gel, a liquid or any combination thereof.

13. The antenna assembly of claim 1, wherein the interior portions each include an infill density formed of a flexible thermoplastic elastomer within the range of about 40% to about 100%.

14. The antenna assembly of claim 13, wherein the dielectric constant of the framework portion is within the range of about 2 to about 3, and the loss tangent of the framework portion is within the range of about 0.04 to about 0.06.

15. The antenna assembly of claim 1, wherein the substrate is planar in a natural state.

16. The antenna assembly of claim 15, wherein the antenna assembly includes at least one of a bandwidth, a frequency, a resonant frequency, a gain and a return loss that varies less than 10% from when the flexible substrate is deformed from the natural state into an arcuate shape along one axis that is defined by a radius of greater than or equal to 28 mm.

17. The antenna assembly of claim 1, wherein the substrate comprises a plurality of coupled tiles, each tile including at least one interior portion of the plurality of interior portions and an associated portion of the framework portion that extends about a portion of the respective at least one interior portion.

18. The antenna assembly of claim 17, wherein the plurality of coupled tiles comprises a plurality of first tiles with at least one projection extending from at least one lateral side thereof, and plurality of second tiles with at least one recess extending from at least one lateral side thereof, and wherein the at least one projection of the first tiles and the at least one recess of the second tiles couple together to couple the tiles together.

19. A method, comprising:
manufacturing a flexible heterogeneous substrate for a flexible radio frequency (RF) device, comprising:
forming a flexible framework portion of a first material composition, the framework portion comprising a first dielectric constant, a first loss tangent, a first volume resistivity, a first surface resistivity and a first magnetic relative permeability; and
forming a plurality of discrete spaced interior portions of second material compositions that differ from the first material composition, the interior portions comprising second dielectric constants, second loss tangents, second volume resistivities, second surface resistivities and second magnetic relative permeabilities,
wherein the framework portion extends fully about at least a portion of each of the interior portions,
wherein the framework portion comprises a flexibility that is greater than flexibilities of at least some of the interior portions,
wherein at least one of the second dielectric constants, the second loss tangents, the second volume resistivities, the second surface resistivities and the first magnetic relative permeabilities of at least one of the interior portions differs from the first dielectric constant, the first loss tangent, the first volume resistivity, the first surface resistivity and the first magnetic relative permeability, respectively, of the framework portion, and
wherein the framework portion comprises at least one of a Young's modulus of less than or equal to 16 Mpa, a yield tensile strength of less than or equal to 5 Mpa and an ultimate tensile strength less than or equal to 32 Mpa, and wherein at least some of the plurality of interior portions comprise at least one of a Young's modulus, a yield tensile strength and an ultimate tensile strength that is at least 100% greater than that of the framework portion.

20. The method of claim 19, further comprising:
forming a flexible RF antenna from the manufactured flexible heterogeneous substrate, comprising:
coupling at least one flexible conductive antenna element to the substrate such that the at least one antenna element extends over a first side of the substrate; and
coupling at least one flexible conductive ground member to the substrate such that the at least one flexible conductive ground member extends over a second side of the substrate that opposes the first side of the substrate.

21. A flexible radio frequency (RF) device, comprising:
at least one flexible substrate comprising a first side, a second side opposing the first side, a flexible framework portion and a plurality of discrete spaced interior portions, the framework portion extending fully about at least a portion of each of the discrete spaced interior portions;
wherein the framework portion comprises a flexibility that is greater than flexibilities of at least some of the interior portions,
wherein each interior portion and the framework portion comprise a dielectric constant, a loss tangent, a volume resistivity, a surface resistivity and a magnetic relative permeability, and wherein at least one of the dielectric constant, the loss tangent, the volume resistivity, the surface resistivity and the magnetic relative permeability of at least one of the interior portions differs from that of the framework portion, and
wherein the framework portion comprises at least one of a Young's modulus of less than or equal to 16 Mpa, a yield tensile strength of less than or equal to 5 Mpa and an ultimate tensile strength less than or equal to 32 Mpa, and wherein at least some of the plurality of interior portions comprise at least one of a Young's modulus, a yield tensile strength and an ultimate tensile strength that is at least 100% greater than that of the framework portion.

22. The device of claim 21, wherein the at least one flexible substrate forms at least one carrier component of a flexible RF device.

23. The device of claim 22, wherein the at least one flexible substrate forms a portion of at least one of an RF antenna, an RF filter, an RF sensor, an RF power divider and an RF detector.

24. The device of claim 21, wherein the framework portion comprises a Young's modulus of less than or equal to 16 Mpa, a yield tensile strength of less than or equal to 5 Mpa and an ultimate tensile strength less than or equal to 32 Mpa, and wherein at least some of the plurality of interior portions comprise a Young's modulus, a yield tensile strength and an ultimate tensile strength that is at least 100% greater than that of the framework portion.

* * * * *